(12) United States Patent
Kim et al.

(10) Patent No.: US 9,882,169 B2
(45) Date of Patent: Jan. 30, 2018

(54) ORGANIC LIGHT EMITTING DISPLAY APPARATUS

(71) Applicant: Samsung Display Co., Ltd., Yongin-si, Gyeonggi-Do (KR)

(72) Inventors: Min-Soo Kim, Seoul (KR); Valeriy Prushinskiy, Hwaseong-si (KR); Mu-Gyeom Kim, Hwaseong-si (KR)

(73) Assignee: Samsung Display Co., Ltd. (KR)

( * ) Notice: Subject to any disclaimer, the term of this patent is extended or adjusted under 35 U.S.C. 154(b) by 7 days.

(21) Appl. No.: 15/209,037

(22) Filed: Jul. 13, 2016

(65) Prior Publication Data

US 2017/0054111 A1 Feb. 23, 2017

(30) Foreign Application Priority Data

Aug. 19, 2015 (KR) .................. 10-2015-0116963

(51) Int. Cl.
*G09G 5/10* (2006.01)
*H01L 51/52* (2006.01)
(Continued)

(52) U.S. Cl.
CPC ...... *H01L 51/5271* (2013.01); *H01L 27/3248* (2013.01); *H01L 27/3276* (2013.01); *H01L 51/56* (2013.01); *G09G 3/2003* (2013.01); *G09G 3/3225* (2013.01); *G09G 3/3266* (2013.01); *G09G 2300/0426* (2013.01); (Continued)

(58) Field of Classification Search
CPC .. G09G 3/2003; G09G 3/3225; G09G 3/3266; G09G 5/10; G09G 2300/0426; G09G 2300/0809; H01L 27/32; H01L 27/3248; H01L 27/3276; H01L 51/52; H01L 51/5271; H01L 51/56; H01L 2227/323; H01L 2251/558

See application file for complete search history.

(56) References Cited

U.S. PATENT DOCUMENTS 7,889,154 B2 * 2/2011 Araki ................... G09G 3/3688
345/204
8,304,981 B2 * 11/2012 Kim ..................... H01L 27/3262
257/59

(Continued)

FOREIGN PATENT DOCUMENTS

KR 10-2009-0099744 A 9/2009
KR 10-2014-0073216 A 6/2014
KR 10-2014-0122132 A 10/2014

*Primary Examiner* — Joe H Cheng
(74) *Attorney, Agent, or Firm* — Innovation Counsel LLP

(57) ABSTRACT

An organic light emitting display apparatus includes a first base substrate which includes a first light emitting area, a second light emitting area and a mirror area, and a second base substrate facing the first base substrate and having a first mirror layer disposed on the second base substrate. The first light emitting area includes a first thin film transistor electrically connected to a scan line, a first pixel electrode connected to the first thin film transistor, and a first light emitting structure disposed on the first pixel electrode. The second light emitting area includes a second thin film transistor electrically connected to an auxiliary scan signal line, a second pixel electrode connected to the second thin film transistor, and a second light emitting structure disposed on the second pixel electrode.

20 Claims, 30 Drawing Sheets

(51) Int. Cl.
    *H01L 27/32* (2006.01)
    *H01L 51/56* (2006.01)
    *G09G 3/20* (2006.01)
    *G09G 3/3225* (2016.01)
    *G09G 3/3266* (2016.01)

(52) U.S. Cl.
    CPC .............. *G09G 2300/0452* (2013.01); *G09G 2300/0842* (2013.01); *H01L 2227/323* (2013.01); *H01L 2251/558* (2013.01)

(56) References Cited

U.S. PATENT DOCUMENTS

| | | | |
|---|---|---|---|
| 8,860,034 B2* | 10/2014 | Prushinskiy | H01L 51/5281 257/72 |
| 8,933,625 B2 | 1/2015 | Chung et al. | |
| 8,946,733 B2* | 2/2015 | Prushinskiy | H01L 27/3241 257/88 |
| 8,975,638 B2* | 3/2015 | Mitsumoto | H01L 27/105 257/72 |
| 9,041,633 B2* | 5/2015 | Park | H05B 33/0896 345/82 |
| 9,111,887 B2* | 8/2015 | Kim | H01L 51/5253 |
| 9,577,020 B2* | 2/2017 | Kaplan | H01L 51/5281 |
| 2004/0239830 A1* | 12/2004 | Nakayoshi | G02F 1/133615 349/61 |
| 2005/0035939 A1* | 2/2005 | Akiyama | G09G 3/3413 345/102 |
| 2005/0225232 A1* | 10/2005 | Boroson | H01L 51/5265 313/504 |
| 2005/0258337 A1* | 11/2005 | Ozawa | G09G 3/3648 250/208.1 |
| 2008/0252570 A1* | 10/2008 | Kwon | G09G 3/3233 345/76 |
| 2010/0148192 A1* | 6/2010 | Jung | H01L 27/3246 257/88 |
| 2010/0225617 A1* | 9/2010 | Yoshimoto | G06F 3/042 345/175 |
| 2011/0175073 A1* | 7/2011 | Chang | H01L 51/5203 257/40 |
| 2012/0049191 A1* | 3/2012 | You | H01L 27/1214 257/59 |
| 2014/0365965 A1 | 12/2014 | Bray et al. | |
| 2017/0047020 A1* | 2/2017 | Yata | G09G 3/3413 |

* cited by examiner

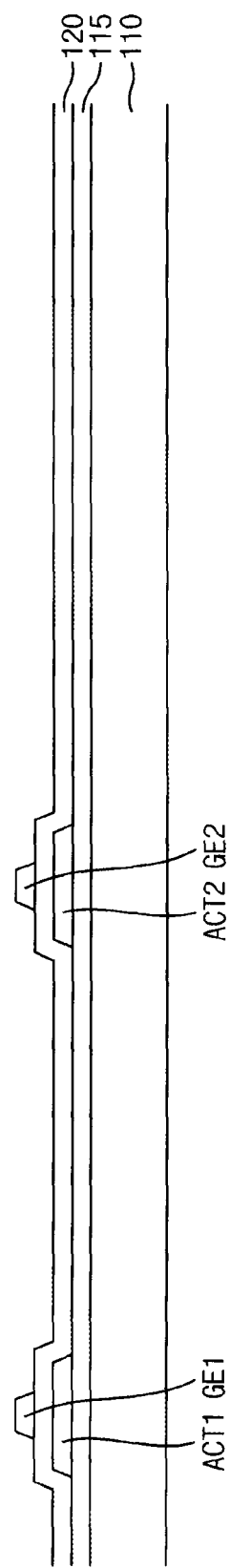

ORGANIC LIGHT EMITTING DISPLAY APPARATUS

This application claims priority under 35 U.S.C. §119 to Korean Patent Application No. 10-2015-0116963, filed on Aug. 19, 2015, the disclosure of which is incorporated by reference herein in its entirety.

BACKGROUND

1. Field

Exemplary embodiments of the inventive concept relate to an organic light emitting display apparatus.

More particularly, exemplary embodiments of the inventive concept relate to an organic light emitting display apparatus having mirror function and display function.

2. Description of the Related Art

A display device displays an image using a pixel emitting light. An organic light emitting display device includes the pixel having an organic light emitting diode (OLED). The OLED emits the light of which wavelength depends on an organic material included in the OLED. For example, the OLED includes the organic material corresponding to one of a red color light, a green color light, and a blue color light. The organic light emitting display device displays the image by mixing the light emitted by the organic materials.

Recently, need of a display apparatus having mirror function and display function has been increased, since wide range of use of display apparatus. However, the display apparatus having mirror function and display function has lower display quality than normal display apparatus due to the mirror function.

ASUMMARY

Summary

One or more exemplary embodiment of the inventive concept provides an organic light emitting display apparatus capable of improving display quality.

According to an exemplary embodiment of the inventive concept, an organic light emitting display apparatus including a first base substrate including a first light emitting area, a second light emitting area and a mirror area, and a second base substrate facing the first base substrate and having a first mirror layer disposed on the second base substrate. The first light emitting area includes a first thin film transistor electrically connected to a scan line, a first pixel electrode connected to the first thin film transistor, and a first light emitting structure disposed on the first pixel electrode. The second light emitting area includes a second thin film transistor electrically connected to an auxiliary scan signal line, a second pixel electrode connected to the second thin film transistor, and a second light emitting structure disposed on the second pixel electrode.

In an exemplary embodiment, the first mirror layer may define openings which overlap the first pixel electrode and the second pixel electrode.

In an exemplary embodiment, the organic light emitting display apparatus may further include a thin film mirror layer overlapping the second pixel electrode, the thin film mirror layer being transflective film configured to partially reflect and partially transmit light.

In an exemplary embodiment, the thin film mirror layer may partially overlap the first mirror layer.

In an exemplary embodiment, the thin film mirror layer may make contact with the second base substrate.

In an exemplary embodiment, the thin film mirror layer may be disposed between the first mirror layer and the second base substrate.

In an exemplary embodiment, thickness of the thin film mirror layer may be smaller than that of the first mirror layer.

In an exemplary embodiment, the organic light emitting display apparatus may further include a second mirror layer which or the first mirror layer and the openings of the first mirror layer.

In an exemplary embodiment, the first light emitting structure and the second light emitting structure may emit light having same color.

In an exemplary embodiment, the first thin film transistor may be electrically connected to a first switching element, the first switching element being connected to the scan. The second thin film transistor may be electrically connected to a second switching element, the second switching element being connected to the auxiliary scan signal line. The data line may be electrically connected to the first switching element and the second switching element.

In an exemplary embodiment, wherein the auxiliary scan signal line may selectively apply a gate on signal to the second switching element when external light is stronger than a predetermined intensity.

In an exemplary embodiment, same data signal may be applied to the first switching element and the second switching element.

In an exemplary embodiment, the auxiliary scan signal line may supply a gate off signal to the second switching element when external light is weaker than a predetermined intensity.

In an exemplary embodiment, the first mirror layer may has a first thickness and define an opening exposing the first pixel electrode. The first mirror layer may have a second thickness in an area overlapping the second pixel electrode, the second thickness being smaller than the first thickness.

In an exemplary embodiment, the first mirror layer having the first thickness may completely reflect external light. The first mirror layer halving the second thickness may partially reflect and partially transmit the external light.

According to an exemplary embodiment of the inventive concept, an organic light emitting display apparatus includes a first pixel to which a first data signal is applied, the first pixel being connected to a scan line, a first auxiliary pixel to which the first data signal is applied, the first auxiliary pixel being disposed adjacent to the first pixel and connected to an auxiliary scan signal line which supplies an auxiliary scan signal, and a first mirror layer which defines an opening corresponding to the first pixel. The auxiliary scan signal may turn on a switch connected to the first auxiliary pixel only when external light is stronger than a predetermined intensity.

In an exemplary embodiment, when the external light is weaker than the predetermined intensity, the auxiliary scan signal may turn off the switch connected to the first auxiliary pixel.

In an exemplary embodiment, the first pixel and the first auxiliary pixel may emit light having a first color.

In an exemplary embodiment, the organic light emitting display apparatus may further include a second pixel to which a second data signal is applied, and a second auxiliary pixel to which the second data signal is applied, the second auxiliary pixel being disposed adjacent to the second pixel. The second pixel and the second auxiliary pixel may emit light having a second color which is different from the first color. The first auxiliary pixel and the second auxiliary pixel may be turned on/off at the same time.

According to an exemplary embodiment of the inventive concept, an organic light emitting display apparatus includes a plurality of unit pixels. The unit pixel includes a first light emitting area, a second light emitting area and a mirror area. In a first driving mode in which external light is weaker than a predetermined intensity, the first light emitting area emits light to display an image, the mirror area reflects external light, and the second light emitting area does not emit light. In a second driving mode in which external light is stronger than the predetermined intensity, the first light emitting area and the second light emitting area emit light to display an image, and the mirror area reflects external light.

According to the exemplary embodiments of the present inventive concept, an organic light emitting display apparatus includes a first mirror layer, first to third pixels and first to third auxiliary pixels. An auxiliary scan signal which control on/off of the first to third auxiliary pixels is applied to the first to third auxiliary pixels.

Accordingly, the organic light emitting display apparatus may perform mirror function and display function. The auxiliary pixel may be turn on/off according to strength of the external light, so that display quality may be improved.

In addition, the pixels and the auxiliary pixels may emit light at the same time, so that current level of each of organic light emitting elements may be reduced in consideration of amount of light emitted. Thus, life of the organic light emitting display apparatus may be improved.

BRIEF DESCRIPTION OF THE DRAWINGS

The above and other features of the inventive concept will become more apparent by describing in detail exemplary embodiments thereof with reference to the accompanying drawings, in which:

FIGS. 12A, 12B, 12C, 12D, 12E, 12F and 12G are cross-sectional views illustrating a method of manufacturing the organic light emitting display panel of FIG. 4;

DETAILED DESCRIPTION

Hereinafter, the inventive concept will be explained in detail with reference to the accompanying drawings.

Figure 1:
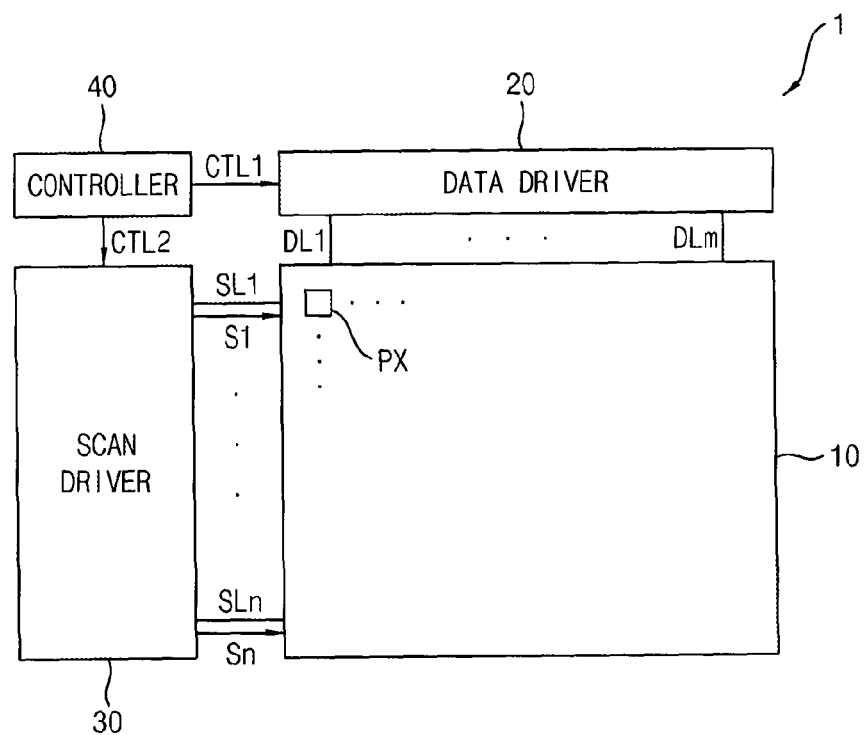
FIG. 1 is a block diagram illustrating an organic light emitting display apparatus according to an exemplary embodiment of the inventive concept.

FIG. 1 is a block diagram illustrating an organic light emitting display apparatus according to an exemplary embodiment of the inventive concept.

Referring to FIG. 1, the organic light emitting display apparatus 1 may include an organic light emitting display panel 10, a data driver 20, a scan driver 30, and a controller 40.

The organic light emitting display panel 10 may include a plurality of unit pixels PX. The organic light emitting display panel 10 may be connected to the data driver 20 via data lines DL1 through DLm. The organic light emitting display panel 10 may be connected to the scan driver 30 via scan lines SL1 through SLn. The organic light emitting display panel 10 may include n*m unit pixels PX because the unit pixels PX are arranged at locations corresponding to crossing points of the scan lines SL1 through SLn and the data lines DL1 through DLm.

Figure 3:
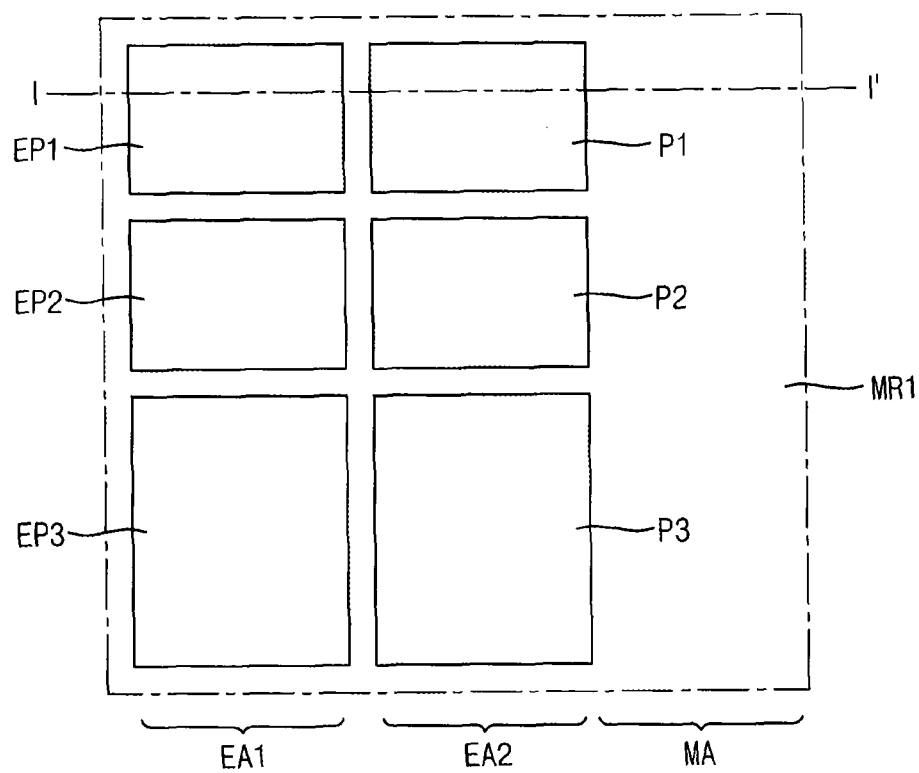
FIG. 3 is a plan view illustrating a unit pixel of an organic light emitting display panel according to an exemplary embodiment of the inventive concept.

The unit pixel PX may include first to third pixels (refers to EP1 to EP3 of FIG. 3), which respectively has red, green and blue color, and first to third auxiliary pixel (refers to P1 to P3 of FIG. 3). Details will be described later.

The data driver 20 may provide a data signal to the unit pixels PX via the data lines DL1 through DLm. For example, the data lines are connected to the first to third pixels individually, so that each of the first to third pixels may receive the data signal through each of the data lines.

The scan driver 30 may provide a scan signal to the unit pixels PX via the scan lines SL1 through SLn. For example, the scan line may provide the scan signal to the first to third pixels by time division driving.

The scan driver 30 may provide auxiliary scan signals (S1 to Sn) to the unit pixel PX of the organic light emitting display panel 10. The auxiliary scan signals may turn on or off the first to third auxiliary pixels of the unit pixel PX as required.

The controller 40 may generate a plurality of control signals CTL1 through CTL2 to control the data driver 20, the scan driver 30

Figure 2:
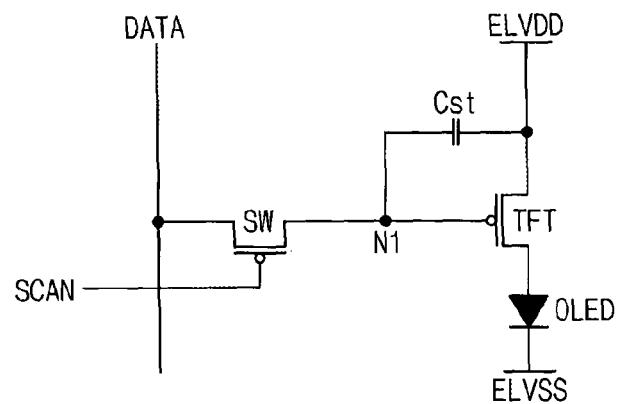
FIG. 2 is a circuit diagram illustrating a pixel included in an organic light emitting display panel of FIG. 1.

FIG. 2 is a circuit diagram illustrating a pixel included in an organic light emitting display panel of FIG. 1.

Referring to FIG. 2, the pixel may represent one of first to third pixel and first to third auxiliary pixel according to an example embodiment. (refers to FIG. 3)

The pixel may include a driving element TFT, a switching element SW, a capacitor Cst, and an organic light emitting diode OLED.

The driving element TFT may be connected between a high power voltage ELVDD and the organic light emitting diode OLED. A control electrode of the driving element TFT may be connected to a first node N1. The driving element TFT may control a magnitude of a driving current flowing the high power voltage ELVDD to the organic light emitting diode OLED.

The switching element SW may be connected between a data line which provides data signal DATA and the first node N1. A control electrode of the switching element SW may be electrically connected to a scan line which provides scan signal SCAN (or auxiliary scan signal).

The capacitor Cst may be connected between the high power voltage ELVDD and the first node N1.

The organic light emitting diode OLED may include a first electrode, a second electrode, and an emission layer. The first electrode of the organic light emitting diode OLED may be electrically connected to the second electrode of the driving element TFT. The second electrode of the organic light emitting diode OLED may be electrically connected to a low power voltage ELVSS. The organic light emitting diode OLED may emit light corresponding to the magnitude of the driving current flowing from the first electrode to the second electrode of the organic light emitting diode OLED.

The magnitude of the driving current may be calculated using [Equation 1] below, $$Id = \frac{\beta}{2}(ELVDD - Vdata - Vth)^2, \qquad \text{[Equation 1]}$$

where Id is the driving current, B is a constant value, ELVDD is the high power voltage, Vdata is a voltage of the data signal, and Vth is a threshold voltage of driving element TFT.

Figure 4:
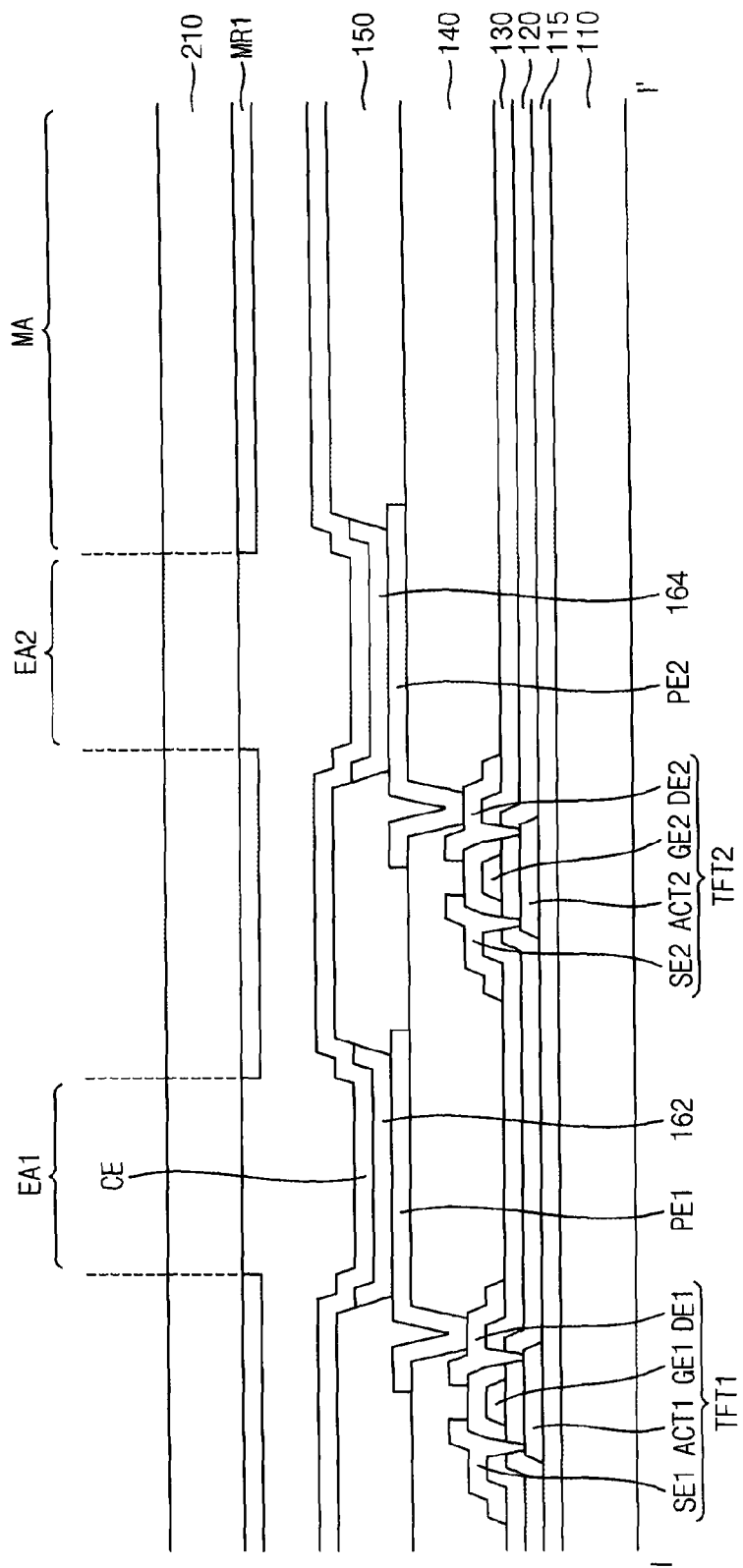
FIG. 4 is a cross-sectional view a taken along line I-I' of FIG. 3.

FIG. 3 is a plan view illustrating a unit pixel of an organic light emitting display panel according to an exemplary embodiment of the inventive concept. FIG. 4 is a cross-sectional view a taken along line I-I' of FIG. 3.

Referring to FIG. 3, the unit pixel may be divided into first light emitting area EA1, a second light emitting area EA2 and a mirror area MA. The unit pixel may include a first pixel EP1, a second pixel EP2 and a third pixel EP3 which are disposed in the first light emitting area EA1. the unit pixel may include a first auxiliary pixel P1, a second auxiliary pixel P2 and a third auxiliary pixel P3 which are disposed in the second light emitting area EA2. The unit pixel may include a first mirror layer MR1 which is disposed at a boundary area between the first to third pixels EP1 to EP3 and the first to third auxiliary pixels P1 to P3, and disposed in the mirror area MA.

Referring to FIG. 4, the organic light emitting display panel may include a first base substrate 110, a buffer layer 115, a first insulation layer 120, a first thin film transistor TFT1, a second thin film transistor TFT2, a second insulation layer 130, a planarization layer 140, a first pixel electrode PE1, a second pixel electrode PE2, a pixel defining layer 150, a first light emitting structure 162, a second light emitting structure 164, an opposite electrode CE, a first mirror layer MR1, and a second base substrate 210.

The first base substrate 110 may include a transparent insulation substrate. For example, the first base substrate 110 may include a glass substrate, a quartz substrate, a transparent resin substrate, etc. Examples of the transparent resin substrate for the first base substrate 110 may include polyimide-based resin, acryl-based resin, polyacrylate-based resin, polycarbonate-based resin, polyether-based resin, sulfonic acid containing resin, polyethyleneterephthalate-based resin, etc.

The buffer layer 115 may be disposed on the first base substrate 110. The buffer layer 115 may prevent diffusion of metal atoms and/or impurities from the first base substrate 110 to the first thin film transistor TFT1, a second thin film transistor TFT2, the first light emitting structure 162 and the second light emitting structure 164. Additionally, the buffer layer 115 may adjust heat transfer rate of a successive crystallization process for first and second active patterns ACT1 and ACT2 which will be mentioned layer, to thereby obtaining a substantially uniform the first and second active patterns ACT1 and ACT2. In case that the first base substrate 110 may have a relatively irregular surface, the buffer layer 115 may improve flatness of the surface of the first base substrate 110. The buffer layer 115 may be formed using a silicon compound. For example, the buffer layer 115 may include silicon oxide (SiOx), silicon nitride (SiNx), silicon oxynitride (SiOxNy), silicon oxycarbide (SiOxCy), silicon carbon nitride (SiCxNy), etc. These may be used alone or in a combination thereof. The buffer layer 115 may have a single layer structure or a multi layer structure. For example, the buffer layer 115 may have a single-layered structure including a silicon oxide film, a silicon nitride film, a silicon oxynitride film, a silicon oxycarbide film or a silicon carbon nitride film. Alternatively, the buffer layer 115 may have a multilayered structure including at least two of a silicon oxide film, a silicon nitride film, a silicon oxynitride film, a silicon oxycarbide film, a silicon carbon nitride film, etc.

The first active pattern ACT1 and the second active pattern ACT2 may be disposed on the buffer layer 115.

Each of the first active pattern ACT1 and the second active pattern ACT2 may include source and drain area which is impurity-doped area, and a channel area between the source area and the drain area.

The first insulation layer 120 which is a gate insulation layer may be disposed on the first base substrate 110 on which the first and second active patterns ACT1 and ACT2 are disposed. The first insulation layer 120 may include a silicon compound, metal oxide, etc. For example, the first insulation layer 120 may be formed using silicon oxide (SiOx), silicon nitride (SiNx), silicon oxynitride (SiOxNy), aluminum oxide (AlOx), tantalum oxide (TaOx), hafnium oxide (HfOx), zirconium oxide (ZrOx), titanium oxide (TiOx), etc. These may be used alone or in a combination thereof. In addition, the first insulation layer 120 may have a single layer structure or a multi layer structure including the silicon oxide and/or the silicon nitride. In example embodiments, the first insulation layer 120 may be uniformly formed on the first base substrate 110 along a profile of the first and second active patterns ACT1 and ACT2. Here, the first insulation layer 120 may have a substantially small thickness, such that a stepped portion may be formed at a portion of the first insulation layer 120 adjacent to the first and second active patterns ACT1 and ACT2. In some example embodiments, the first insulation layer 120 may have a relatively large thickness for sufficiently covering the first and second active pattern ACT1 and ACT2, so that a surface of the first insulation layer 120 may have a substantially flat surface.

A gate pattern may be disposed on the first insulation layer 120. The gate pattern may include metal, alloy, conductive metal oxide, a transparent conductive material, etc.

The gate pattern may include first and second gate electrode GE1 and GE2 which respectively overlap the first and second active pattern ACT1 and ACT2, signal lines to transmit signals for driving the pixel such as a gate line, and a first storage electrode.

The second insulation layer 130 which is a passivation layer may be disposed on the first insulation layer 120 on which the gate pattern is disposed. The second insulation layer 130 may insulate the first and second gate electrodes GE1 and GE2 from the first and second source electrodes SE1 and SE2 and the first and second drain electrodes DE1 and DE2. The second insulation layer 130 may be uniformly formed on the first insulation layer 120 along a profile of the gate pattern. Here, the second insulation layer 130 may have a substantially small thickness, such that a stepped portion may be formed at a portion of the second insulation layer 130 adjacent to the gate pattern. The second insulation layer 130 may include a silicon compound, etc. For example, the second insulation layer 130 may be formed using silicon oxide (SiOx), silicon nitride (SiNx), silicon oxynitride (SiOxNy), etc.

A data pattern may be disposed on the second insulation layer 130. The data pattern may include the first and second source electrodes SE1 and SE2, the first and second drain electrodes DE1 and DE2, a signal line to transmit driving signal for the pixel such as a data line and a second storage electrode. The first and second source electrode SE1 and SE2 may be electrically connected to the first and second active patterns ACT1 and ACT2 through contact holes formed through the first and second insulation layers 120 and 130, respectively. The first source electrode SE1 and the first drain electrode DE1 may be electrically connected to the first active pattern ACT1 through the contact holes formed through the first and second insulation layers 120 and 130. The second source electrode SE2 and the second drain electrode DE2 may be electrically connected to the second active pattern ACT2 through the contact holes formed through the first and second insulation layers 120 and 130.

The first active pattern ACT1, the first gate electrode GE1, the first drain electrode DE1 and the first source electrode SE1 may be included in the first thin film transistor TFT1. The second active pattern ACT2, the second gate electrode GE2, the second drain electrode DE2 and the second source electrode SE2 may be included in the second thin film transistor TFT2.

The first thin film transistor TFT1 may be a driving element of the first pixel of the organic light emitting display apparatus. The second thin film transistor TFT2 may be a driving element of the first auxiliary pixel of the organic light emitting display apparatus.

The planarization layer 140 may be disposed on the second insulation layer 130 in which the first and second thin film transistors TFT1 and TFT2 are disposed. The planarization layer 140 may have a single-layered structure or a multi-layered structure including at least two insulation films. The planarization layer 140 may be formed using an organic material. For example, the planarization layer 140 may include photoresist, acryl-based resin, polyimide-based resin, polyamide-based resin, siloxane-based resin, etc. These may be used alone or in a combination thereof. Alternatively, the planarization layer 140 may include an inorganic material. For example, the planarization layer 140 may be formed using silicon oxide, silicon nitride, silicon oxynitride, silicon oxycarbide, aluminum, magnesium, zinc, hafnium, zirconium, titanium, tantalum, aluminum oxide, titanium oxide, tantalum oxide, magnesium oxide, zinc oxide, hafnium oxide, zirconium oxide, titanium oxide, etc. These may be used alone or in a mixture thereof.

The first pixel electrode PE1 may be disposed on the planarization layer 140. The first pixel electrode PE1 may be connected to the first drain electrode DE1 which is exposed by a first contact hole which is formed through the planarization layer 140. The first pixel electrode PE1 may be disposed corresponding to the first light emitting area EA1.

In some example embodiments, a contact, a plug or a pad may be formed in the first contact hole, and then the first pixel electrode PE1 may be formed on the contact, the plug or the pad. Here, the first pixel electrode PE1 may be electrically connected to the first drain electrode DE1 through the contact, the plug or the pad.

The second pixel electrode PE2 may be disposed on the planarization layer 140. The second pixel electrode PE2 may be electrically connected to the second drain electrode DE2 through a second contact hole formed through the planarization layer 140. The second pixel electrode PE2 may be disposed corresponding to the second light emitting area EA2.

In some example embodiments, a contact, a plug or a pad may be formed in the second contact hole, and then the second pixel electrode PE2 may be formed on the contact, the plug or the pad. Here, the second pixel electrode PE2 may be electrically connected to the second drain electrode DE2 through the contact, the plug or the pad.

The display apparatus may be front emission type structure, so that the first and second pixel electrodes PE1 and PE2 may include a reflective material. For example, the first and second pixel electrodes PE1 and PE2 may be formed using aluminum, alloy containing aluminum, aluminum nitride, silver, alloy containing silver, tungsten, tungsten nitride, copper, alloy containing copper, nickel, alloy containing nickel, chrome, chrome nitride, molybdenum, alloy containing molybdenum, titanium, titanium nitride, platinum, tantalum, tantalum nitride, neodymium, scandium, strontium ruthenium oxide, zinc oxide, indium tin oxide, tin oxide, indium oxide, gallium oxide, indium zinc oxide, etc. These may be used alone or in a combination thereof. In example embodiments, the first and second pixel electrodes PE1 and PE2 may have a single layer structure or a multi layer structure.

The pixel defining layer 150 may be disposed on the planarization layer 140 on which the first and second pixel electrodes PE1 and PE2 are formed. The pixel defining layer 150 may include a transparent organic material or a transparent inorganic material. For example, the pixel defining layer 150 may be formed using photoresist, acryl-based resin, polyacryl-based resin, polyimide-based resin, a silicon compound, etc.

In addition, the pixel defining layer 150 may be obtained on the first and second pixel electrodes PE1 and PE2 by a spin coating process, a spray process, a printing process, a CVD process, a PECVD process, an HDP-CVD process, etc. In example embodiments, the pixel defining layer 150 may be partially etched to form an opening partially exposing the first and second pixel electrodes PE1 and PE2.

The first light emitting structure 162 may be disposed on the first pixel electrode PE1 exposed by the opening of the pixel defining layer 150. The first light emitting structure 162 may extend on a sidewall of the opening of the pixel defining layer 150. The first light emitting structure 162 may include an organic light emitting layer (EL), a hole injection layer (HIL), a hole transfer layer (HTL), an electron transfer layer (ETL), an electron injection layer (EIL), etc. In example embodiments, a plurality of organic light emitting layers may be formed using light emitting materials for generating different colors of light such as a red color of light, a green color of light and a blue color of light in accordance with color pixels of the display device. In some example embodiments, the organic light emitting layer of the of the first light emitting structure 162 may include a plurality of stacked light emitting materials for generating a red color of light, a green color of light and a blue color of light to thereby emitting a white color of light.

The second light emitting structure 164 may be disposed on the second pixel electrode PE2 exposed by the opening of the pixel defining layer 150. The second light emitting structure 164 may extend on a sidewall of the opening of the pixel defining layer 150. The second light emitting structure 164 may include an organic light emitting layer (EL), a hole injection layer (HIL), a hole transfer layer (HTL), an electron transfer layer (ETL), an electron injection layer (EIL), etc. In example embodiments, a plurality of organic light emitting layers may be formed using light emitting materials for generating different colors of light such as a red color of light, a green color of light and a blue color of light in accordance with color pixels of the display device. In some example embodiments, the organic light emitting layer of the of the second light emitting structure 164 may include a plurality of stacked light emitting materials for generating a red color of light, a green color of light and a blue color of light to thereby emitting a white color of light.

The opposite electrode CE may be disposed on the first and second light emitting structures 162 and 164 and the pixel defining layer 150. The display apparatus may be front emission type structure, so that opposite electrode CE may include a transmissive material. For example, the opposite electrode CE may be formed using aluminum, alloy containing aluminum, aluminum nitride, silver, alloy containing silver, tungsten, tungsten nitride, copper, alloy containing copper, nickel, alloy containing nickel, chrome, chrome nitride, molybdenum, alloy containing molybdenum, titanium, titanium nitride, platinum, tantalum, tantalum nitride, neodymium, scandium, strontium ruthenium oxide, zinc oxide, indium tin oxide, tin oxide, indium oxide, gallium oxide, indium zinc oxide, etc. These may be used alone or in a combination thereof. In example embodiments, the opposite electrode CE may also have a single layer structure or a multi layer structure, which may include a metal film, an alloy film, a metal nitride film, a conductive metal oxide film and/or a transparent conductive film. The opposite electrode made of materials having reflection characteristic may be made thin for transmission of light.

The second base substrate 210 may be disposed on the opposite electrode CE. The second base substrate 210 may include a glass substrate, a quartz substrate, a transparent resin substrate, etc. Examples of the transparent resin substrate for the second base substrate 210 may include polyimide-based resin, acryl-based resin, polyacrylate-based resin, polycarbonate-based resin, polyether-based resin, sulfonic acid containing resin, polyethyleneterephthalate-based resin, etc.

In example embodiments, a predetermined space may be provided between the opposite electrode CE and the second base substrate 120. This space may be filled with an air or an inactive gas such as a nitrogen ($N_2$) gas. In some example embodiments, a protection layer (not illustrated) may be additionally disposed between the opposite electrode CE and the second base substrate 210. Here, the protection layer may include a resin, for example, photoresist, acryl-based resin, polyimide-based resin, polyamide-based resin, siloxane-based resin, etc. These may be used or in a combination thereof.

The first mirror layer MR1 may be disposed on the second base substrate 210. The first mirror layer MR1 may define openings corresponding to the first light emitting area EA1 and the second emitting area EA2. The first mirror layer MR1 may include a material having high reflectivity such as metal to reflect external light. For example, the first mirror layer MR1 may include aluminum (Al), chrome (Cr), silver (Ag), iron (Fe), platinum (Pt), mercury (Hg), nickel (Ni), tungsten (W), vanadium (V), molybdenum (Mo) and etc. In some example embodiment, the first mirror layer MR1 may have multi layer structure having transparent conductive metal oxide layer and metal layer. For example, the first mirror layer MR1 may include ITO/Ag/ITO triple layers.

Referring to FIGS. 1 to 4, the organic light emitting display apparatus normally performs mirror function by external light reflection of the mirror layer MR1 and simultaneously displays an image by light emission of the first to third pixel EP1 to EP3 in the first light emitting area EA1. In addition, the organic light emitting display apparatus may display an image having higher brightness and definition due to additional light emission of the first to third auxiliary pixels P1 to P3 in the second light emitting area EA2 when the external light is stronger than predetermined reference. Thus, display quality of the organic light emitting display apparatus may be improved regardless of the intensity of the external light such the light of the sun.

Figure 5:
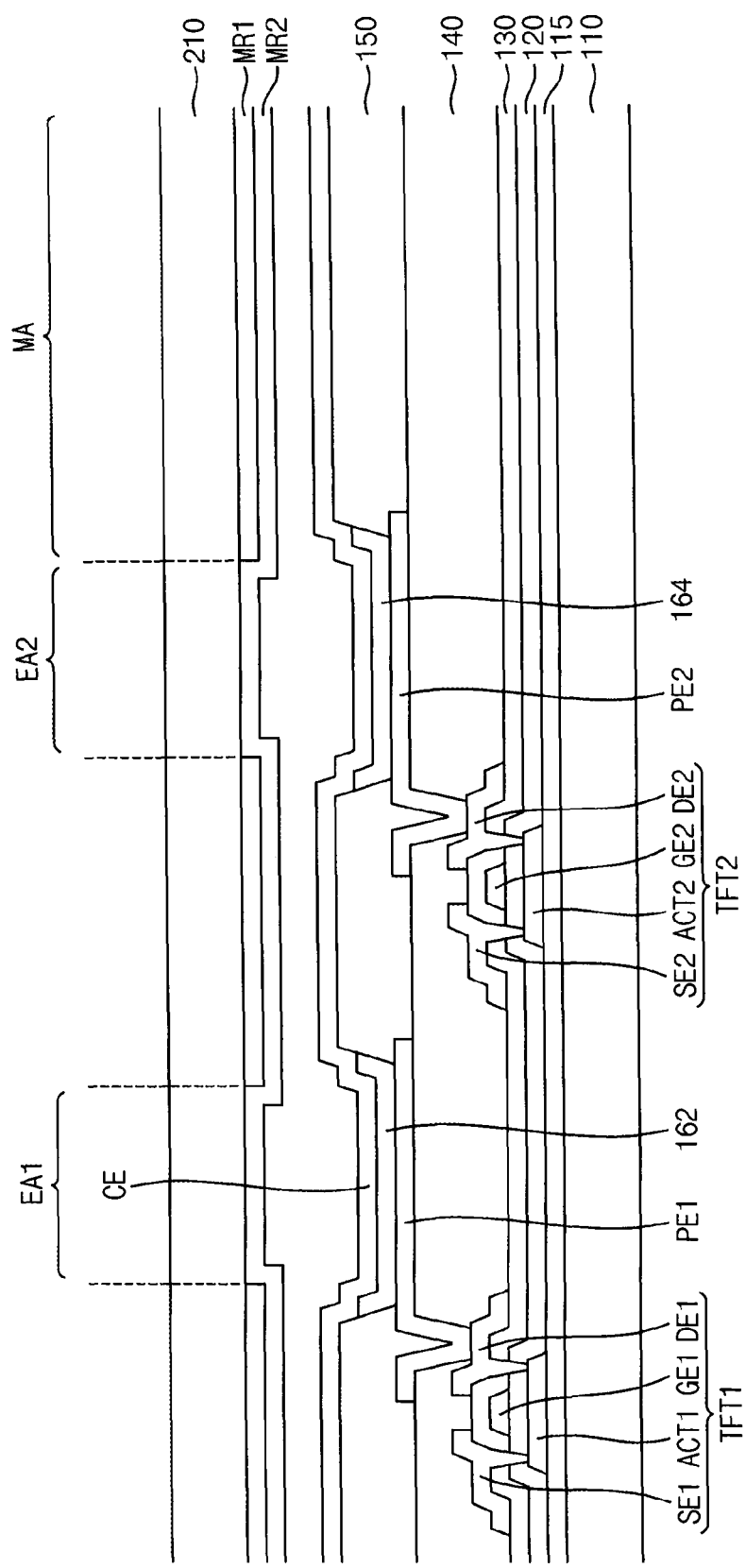
FIG. 5 is a cross-sectional view illustrating an organic light emitting display panel according to an exemplary embodiment of the inventive concept.

FIG. 5 is a cross-sectional view illustrating an organic light emitting display panel according to an exemplary embodiment of the inventive concept.

Referring to FIG. 5, the organic light emitting display panel is substantially same as the organic light emitting display panel of FIG. 4 except for a second mirror layer MR2. Thus, any further detailed descriptions concerning the same elements will be briefly described or omitted.

The organic light emitting display panel may include a first base substrate 110, a buffer layer 115, a first insulation layer 120, a first thin film transistor TFT1, a second thin film transistor TFT2, a second insulation layer 130, a planarization layer 140, a first pixel electrode PE1, a second pixel electrode PE2, a pixel defining layer 150, a first light emitting structure 162, a second light emitting structure 164, an opposite electrode CE, a first mirror layer MR1, a second mirror layer MR2 and a second base substrate 210.

The first base substrate 110 may include a transparent insulation substrate. The buffer layer 115 may be disposed on the first base substrate 110. The first active pattern ACT1 and the second active pattern ACT2 may be disposed on the buffer layer 115. The first insulation layer 120 may be disposed on the first base substrate 110 on which the first and second active patterns ACT1 and ACT2 are disposed. A gate pattern may be disposed on the first insulation layer 120. The gate pattern may include first and second gate electrode GE1 and GE2 which respectively overlap the first and second active pattern ACT1 and ACT2, signal lines to transmit signals for driving the pixel such as a gate line, and a first storage electrode. The second insulation layer 130 may be disposed on the first insulation layer 120 on which the gate pattern is disposed. A data pattern may be disposed on the second insulation layer 130. The data pattern may include the first and second source electrodes SE1 and SE2, the first and second drain electrodes DE1 and DE2, a signal line to transmit driving signal for the pixel such as a data line and a second storage electrode. The first active pattern ACT1, the first gate electrode GE1, the first drain electrode DE1 and the first source electrode SE1 may be included in the first thin film transistor TFT1. The second active pattern ACT2, the second gate electrode GE2, the second drain electrode DE2 and the second source electrode SE2 may be included in the second thin film transistor TFT2. The planarization layer 140 may be disposed on the second insulation layer 130 in which the first and second thin film transistors TFT1 and TFT2 are disposed.

The first pixel electrode PE1 may be disposed on the planarization layer 140. The second pixel electrode PE2 may be disposed on the planarization layer 140. The pixel defining layer 150 may be disposed on the planarization layer 140 on which the first and second pixel electrodes PE1 and PE2 are formed. The first light emitting structure 162 may be disposed on the first pixel electrode PE1 exposed by the opening of the pixel defining layer 150. The second light emitting structure 164 may be disposed on the second pixel electrode PE2 exposed by the opening of the pixel defining layer 150. The opposite electrode CE may be disposed on the first and second light emitting structures 162 and 164 and the pixel defining layer 150.

The second base substrate 210 may be disposed on the opposite electrode CE. The second base substrate 210 may include a glass substrate, a quartz substrate, a transparent resin substrate, etc. Examples of the transparent resin substrate for the second base substrate 210 may include polyimide-based resin, acryl-based resin, polyacrylate-based resin, polycarbonate-based resin, polyether-based resin, sulfonic acid containing resin, polyethyleneterephthalate-based resin, etc.

In example embodiments, a predetermined space may be provided between the opposite electrode CE and the second base substrate 120. This space may be filled with an air or an inactive gas such as a nitrogen ($N_2$) gas. In some example embodiments, a protection layer (not illustrated) may be additionally disposed between the opposite electrode CE and the second base substrate 210. Here, the protection layer may include a resin, for example, photoresist, acryl-based resin, polyimide-based resin, polyamide-based resin, siloxane-based resin, etc.

The first mirror layer MR1 may be disposed on the second base substrate 210. The first mirror layer MR1 may define openings corresponding to the first light emitting area EA1 and the second emitting area EA2. The first mirror layer MR1 may include a material having high reflectivity such as metal to reflect external light. For example, the first mirror layer MR1 may include aluminum (Al), chrome (Cr), silver (Ag), iron (Fe), platinum (Pt), mercury (Hg), nickel (Ni), tungsten (W), vanadium (V), molybdenum (Mo) and etc. In some example embodiment, the first mirror layer MR1 may have multi layer structure having transparent conductive metal oxide layer and metal layer. For example, the first mirror layer MR1 may include ITO/Ag/ITO triple layers.

The second mirror layer MR2 may be disposed on the second base substrate 210 on which the first mirror layer MR1 is disposed. The second mirror layer MR2 may be formed in entire of the first light emitting area EA1, the second light emitting area EA2 and the mirror area MA. The second mirror layer MR2 may include a material which is the same as that of the first mirror layer MR1 or different from that of the first mirror layer MR1. Thickness of the second mirror layer MR2 may be smaller than thickness of the first mirror layer MR1. The second mirror layer MR2 may partially reflect and partially transmit external light in the first and second light emitting areas EA1 and EA2. The second mirror layer MR2 may include a material having high reflectivity such as metal to reflect external light. For example, the second mirror layer MR2 may include aluminum (Al), chrome (Cr), silver (Ag), iron (Fe), platinum (Pt), mercury (Hg), nickel (Ni), tungsten (W), vanadium (V), molybdenum (Mo) and etc. In some example embodiment, the first mirror layer MR1 may have multi layer structure having transparent conductive metal oxide layer and metal layer. For example, the second mirror layer MR2 may include ITO/Ag/ITO triple layers.

The second mirror layer MR2 may cover a boundary of the first mirror layer MR1, so that blurring due to a scattered reflection at the boundary of the first mirror layer MR1 may be decreased.

Figure 6:
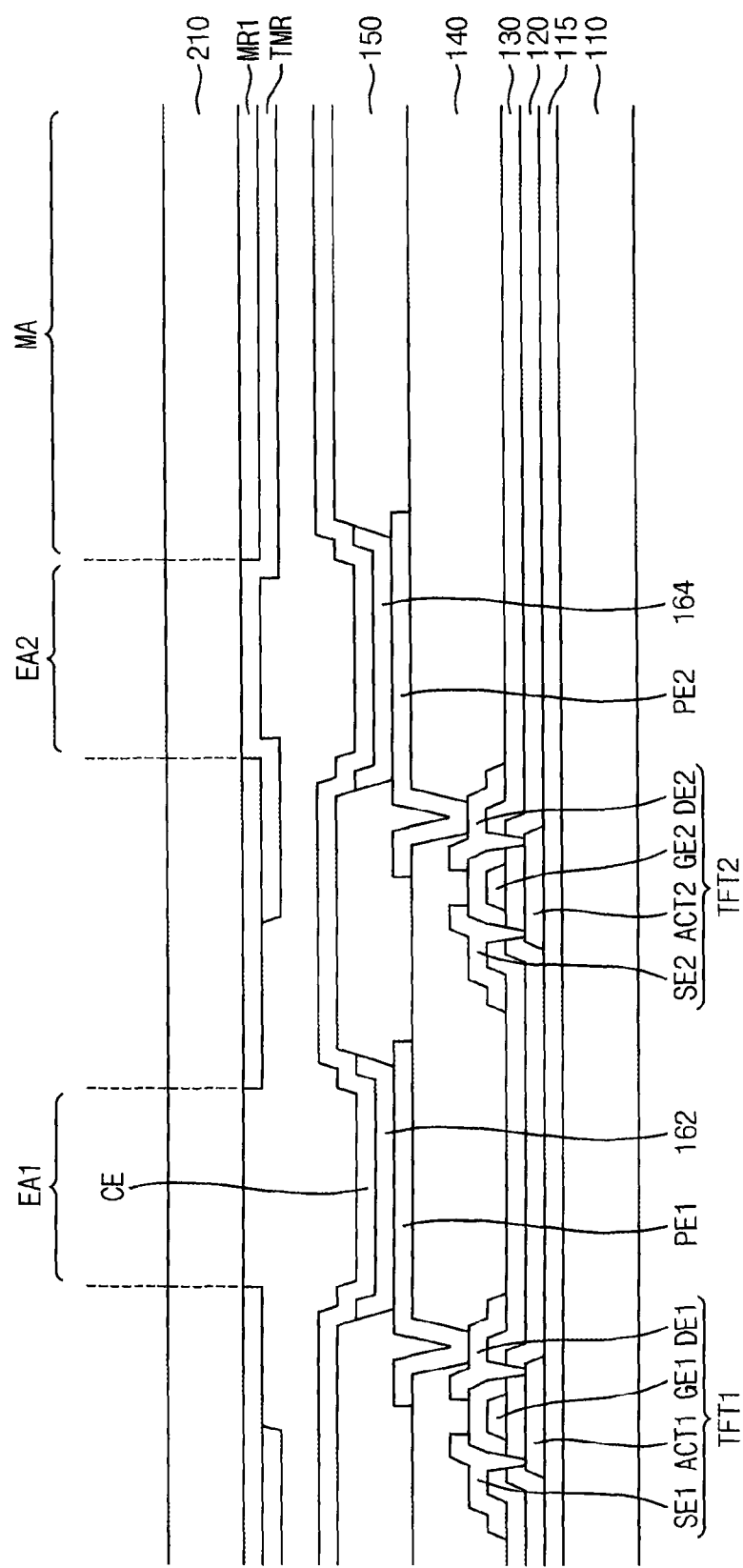
FIG. 6 is a cross-sectional view illustrating an organic light emitting display panel according to an exemplary embodiment of the inventive concept.

FIG. 6 is a cross-sectional view illustrating an organic light emitting display panel according to an exemplary embodiment of the inventive concept.

Referring to FIG. 6, the organic light emitting display panel is substantially same as the organic light emitting display panel of FIG. 4 except for a thin mirror layer TMR. Thus, any further detailed descriptions concerning the same elements will be briefly described or omitted.

The organic light emitting display panel may include a first base substrate 110, a buffer layer 115, a first insulation layer 120, a first thin film transistor TFT1, a second thin film transistor TFT2, a second insulation layer 130, a planarization layer 140, a first pixel electrode PE1, a second pixel electrode PE2, a pixel defining layer 150, a first light emitting structure 162, a second light emitting structure 164, an opposite electrode CE, a first mirror layer MR1, a thin mirror layer TMR and a second base substrate 210.

The first base substrate 110 may include a transparent insulation substrate. The buffer layer 115 may be disposed on the first base substrate 110. The first active pattern ACT1 and the second active pattern ACT2 may be disposed on the buffer layer 115. The first insulation layer 120 may be disposed on the first base substrate 110 on which the first and second active patterns ACT1 and ACT2 are disposed. A gate pattern may be disposed on the first insulation layer 120. The gate pattern may include first and second gate electrode GE1 and GE2 which respectively overlap the first and second active pattern ACT1 and ACT2, signal lines to transmit signals for driving the pixel such as a gate line, and a first storage electrode. The second insulation layer 130 may be disposed on the first insulation layer 120 on which the gate pattern is disposed. A data pattern may be disposed on the second insulation layer 130. The data pattern may include the first and second source electrodes SE1 and SE1, the first and second drain electrodes DE1 and DE2, a signal line to transmit driving signal for the pixel such as a data line and a second storage electrode. The first active pattern ACT1, the first gate electrode GE1, the first drain electrode DE1 and the first source electrode SE1 may be included in the first thin film transistor TFT1. The second active pattern ACT2, the second gate electrode GE2, the second drain electrode DE2 and the second source electrode SE2 may be included in the second thin film transistor TFT2. The planarization layer 140 may be disposed on the second insulation layer 130 in which the first and second thin film transistors TFT1 and TFT2 are disposed.

The first pixel electrode PE1 may be disposed on the planarization layer 140. The second pixel electrode PE2 may be disposed on the planarization layer 140. The pixel defining layer 150 may be disposed on the planarization layer 140 on which the first and second pixel electrodes PE1 and PE2 are formed. The first light emitting structure 162 may be disposed on the first pixel electrode PE1 exposed by the opening of the pixel defining layer 150. The second light emitting structure 164 may be disposed on the second pixel electrode PE2 exposed by the opening of the pixel defining layer 150. The opposite electrode CE may be disposed on the first and second light emitting structures 162 and 164 and the pixel defining layer 150.

The second base substrate 210 may be disposed on the opposite electrode CE. The second base substrate 210 may include a glass substrate, a quartz substrate, a transparent resin substrate, etc. Examples of the transparent resin substrate for the second base substrate 210 may include polyimide-based resin, acryl-based resin, polyacrylate-based resin, polycarbonate-based resin, polyether-based resin, sulfonic acid containing resin, polyethyleneterephthalate-based resin, etc.

In example embodiments, a predetermined space may be provided between the opposite electrode CE and the second base substrate 120. This space may be filled with an air or an inactive gas such as a nitrogen (N$_2$) gas. In some example embodiments, a protection layer (not illustrated) may be additionally disposed between the opposite electrode CE and the second base substrate 210. Here, the protection layer may include a resin, for example, photoresist, acryl-based resin, polyimide-based resin, polyamide-based resin, siloxane-based resin, etc.

The first mirror layer MR1 may be disposed on the second base substrate 210. The first mirror layer MR1 may define openings corresponding to the first light emitting area EA1 and the second emitting area EA2. The first mirror layer MR1 may include a material having high reflectivity such as metal to reflect external light. For example, the first mirror layer MR1 may include aluminum (Al), chrome (Cr), silver (Ag), iron (Fe), platinum (Pt), mercury (Hg), nickel (Ni), tungsten (W), vanadium (V), molybdenum (Mo) and etc. In some example embodiment, the first mirror layer MR1 may have multi layer structure having transparent conductive metal oxide layer and metal layer. For example, the first mirror layer MR1 may include ITO/Ag/ITO triple layers.

The thin mirror layer TMR may be disposed on the second base substrate 210 on which the first mirror layer MR1 is disposed. The thin mirror layer TMR may be formed in the second light emitting area EA2, but may not be formed in the first light emitting area EA1. A portion of the thin mirror layer TMR may be formed in the mirror area MA for convenient manufacturing process. The thin mirror layer TMR may include a material which is the same as that of the first mirror layer MR1 or different from that of the first mirror layer MR1. Thickness of the thin mirror layer TMR may be smaller than thickness of the first mirror layer MR1. The thin mirror layer TMR may partially reflect and partially transmit external light in the second light emitting area EA2. Thus, the thin mirror layer TMR may be a transflective film. The thin mirror layer TMR may include metal such as aluminum (Al), chrome (Cr), silver (Ag), iron (Fe), platinum (Pt), mercury (Hg), nickel (Ni), tungsten (W), vanadium (V), molybdenum (Mo) and etc. In some example embodiment, the thin mirror layer TMR may have multi layer structure having transparent conductive metal oxide layer and metal layer. For example, the thin mirror layer TMR may include ITO/Ag/ITO triple layers.

Figure 7:
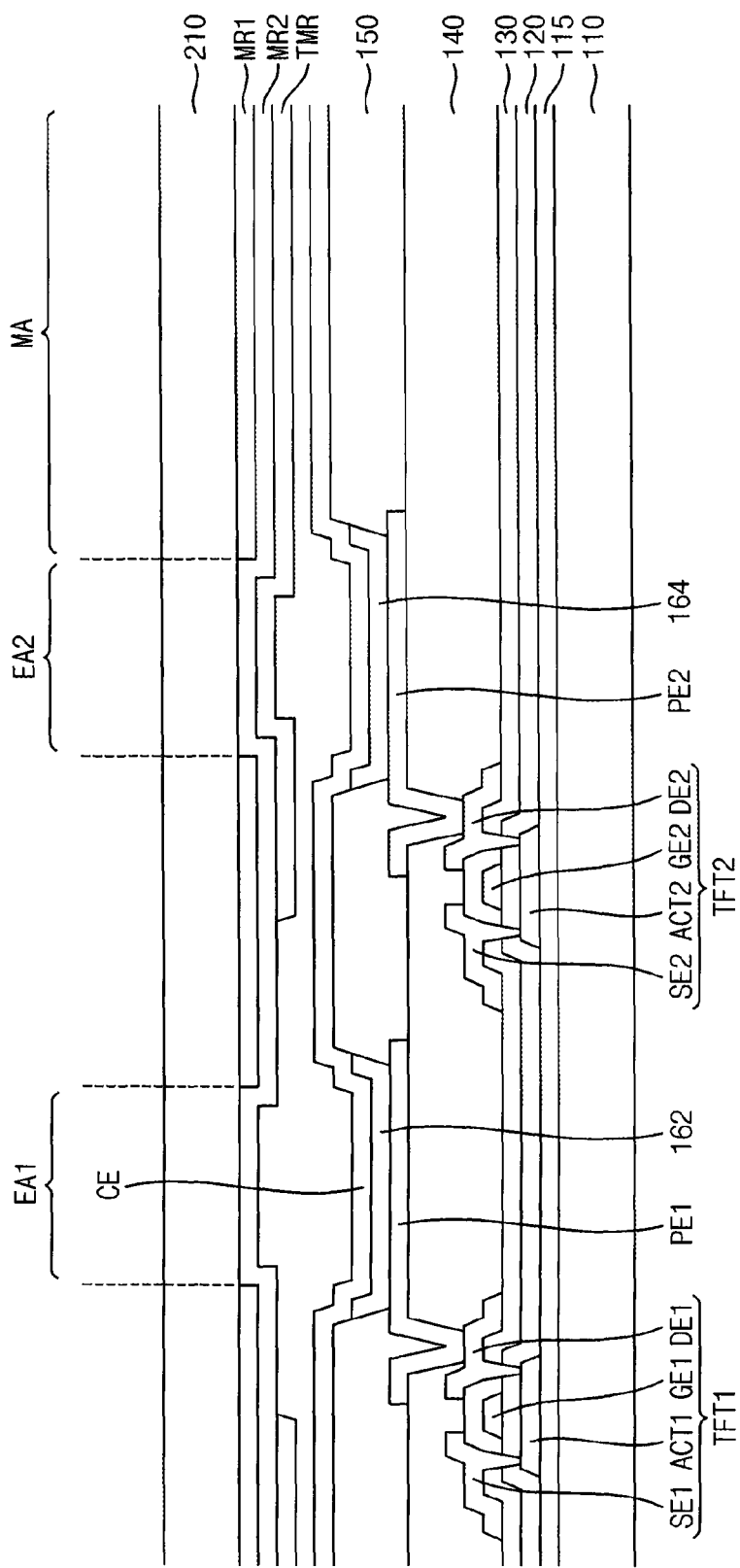
FIG. 7 is a cross-sectional view illustrating an organic light emitting display panel according to an exemplary embodiment of the inventive concept.

FIG. 7 is a cross-sectional view illustrating an organic light emitting display panel according to an exemplary embodiment of the inventive concept.

Referring to FIG. 7, the organic light emitting display panel is substantially the same as the organic light emitting display panel of FIG. 5 except for a thin mirror layer TMR. Thus, any further detailed descriptions concerning the same elements will be briefly described or omitted.

The organic light emitting display panel may include a first base substrate 110, a buffer layer 115, a first insulation layer 120, a first thin film transistor TFT1, a second thin film transistor TFT2, a second insulation layer 130, a planarization layer 140, a first pixel electrode PE1, a second pixel electrode PE2, a pixel defining layer 150, a first light emitting structure 162, a second light emitting structure 164, an opposite electrode CE, a first mirror layer MR1, a second mirror layer MR2, thin film mirror layer TMR and a second base substrate 210.

The first base substrate 110 may include a transparent insulation substrate. The buffer layer 115 may be disposed on the first base substrate 110. The first active pattern ACT1 and the second active pattern ACT2 may be disposed on the buffer layer 115. The first insulation layer 120 may be disposed on the first base substrate 110 on which the first and second active patterns ACT1 and ACT2 are disposed. A gate pattern may be disposed on the first insulation layer 120. The gate pattern may include first and second gate electrode GE1 and GE2 which respectively overlap the first and second active pattern ACT1 and ACT2, signal lines to transmit signals for driving the pixel such as a gate line, and a first storage electrode. The second insulation layer 130 may be disposed on the first insulation layer 120 on which the gate pattern is disposed. A data pattern may be disposed on the second insulation layer 130. The data pattern may include the first and second source electrodes SE1 and SE1, the first and second drain electrodes DE1 and DE2, a signal line to transmit driving signal for the pixel such as a data line and a second storage electrode. The first active pattern ACT1, the first gate electrode GE1, the first drain electrode DE1 and the first source electrode SE1 may be included in the first thin film transistor TFT1. The second active pattern ACT2, the second gate electrode GE2, the second drain electrode DE2 and the second source electrode SE2 may be included in the second thin film transistor TFT2. The planarization layer 140 may be disposed on the second insulation layer 130 in which the first and second thin film transistors TFT1 and TFT2 are disposed.

The first pixel electrode PE1 may be disposed on the planarization layer 140. The second pixel electrode PE2 may be disposed on the planarization layer 140. The pixel defining layer 150 may be disposed on the planarization layer 140 on which the first and second pixel electrodes PE1 and PE2 are formed. The first light emitting structure 162 may be disposed on the first pixel electrode PE1 exposed by the opening of the pixel defining layer 150. The second light emitting structure 164 may be disposed on the second pixel electrode PE2 exposed by the opening of the pixel defining layer 150. The opposite electrode CE may be disposed on the first and second light emitting structures 162 and 164 and the pixel defining layer 150.

The second base substrate 210 may be disposed on the opposite electrode CE. The second base substrate 210 may include a glass substrate, a quartz substrate, a transparent resin substrate, etc.

In example embodiments, a predetermined space may be provided between the opposite electrode CE and the second base substrate 120. This space may be filled with an air or an inactive gas such as a nitrogen (N$_2$) gas. In some example embodiments, a protection layer (not illustrated) may be additionally disposed between the opposite electrode CE and the second base substrate 210. Here, the protection layer may include a resin, for example, photoresist, acryl-based resin, polyimide-based resin, polyamide-based resin, siloxane-based resin, etc.

The first mirror layer MR1 may be disposed on the second base substrate 210. The first mirror layer MR1 may define openings corresponding to the first light emitting area EA1 and the second emitting area EA2. The first mirror layer MR1 may include a material having high reflectivity such as metal to reflect external light. For example, the first mirror layer MR1 may include aluminum (Al), chrome (Cr), silver (Ag), iron (Fe), platinum (Pt), mercury (Hg), nickel (Ni), tungsten (W), vanadium (V), molybdenum (Mo) and etc. In some example embodiment, the first mirror layer MR1 may have multi layer structure having transparent conductive metal oxide layer and metal layer. For example, the first mirror layer MR1 may include ITO/Ag/ITO triple layers.

The second mirror layer MR2 may be disposed on the second base substrate 210 on which the first mirror layer MR1 is disposed. The second mirror layer MR2 may be formed in entire of the first light emitting area EA1, the second light emitting area EA2 and the mirror area MA. The second mirror layer MR2 may include a material which is same as that of the first mirror layer MR1 or different from that of the first mirror layer MR1. Thickness of the second mirror layer MR2 may be smaller than thickness of the first mirror layer MR1. The second mirror layer MR2 may partially reflect and partially transmit external light in the first and second light emitting areas EA1 and EA2. The second mirror layer MR2 may include a material having high reflectivity such as metal to reflect external light. For example, the second mirror layer MR2 may include aluminum (Al), chrome (Cr), silver (Ag), iron (Fe), platinum (Pt), mercury (Hg), nickel (Ni), tungsten (W), vanadium (V), molybdenum (Mo) and etc. In some example embodiment, the first mirror layer MR1 may have multi layer structure having transparent conductive metal oxide layer and metal layer. For example, the second mirror layer MR2 may include ITO/Ag/ITO triple layers.

The thin mirror layer TMR may be disposed on the second mirror layer MR2. The thin mirror layer TMR may be formed in the second light emitting area EA2 but may not be formed in the first light emitting area EA1. A portion of the thin mirror layer TMR may be formed in the mirror area MA for convenient manufacturing process. The thin mirror layer TMR may include a material which is the same as that of the first mirror layer MR1 and/or the second mirror layer MR2 or different from that of the first mirror layer MR1 and/or the second mirror layer MR2. Thickness of the thin mirror layer TMR may be smaller than thickness of the first mirror layer MR1 and thickness of the second mirror layer MR2. The thin mirror layer TMR may partially reflect and partially transmit external light in the second light emitting area EA2. Thus, the thin mirror layer TMR may be a transflective film. The thin mirror layer TMR may include metal such as aluminum (Al), chrome (Cr), silver (Ag), iron (Fe), platinum (Pt), mercury (Hg), nickel (Ni), tungsten (W), vanadium (V), molybdenum (Mo) and etc. In some example embodiment, the thin mirror layer TMR may have multi layer structure having transparent conductive metal oxide layer and metal layer. For example, the thin mirror layer TMR may include ITO/Ag/ITO triple layers.

Figure 8:
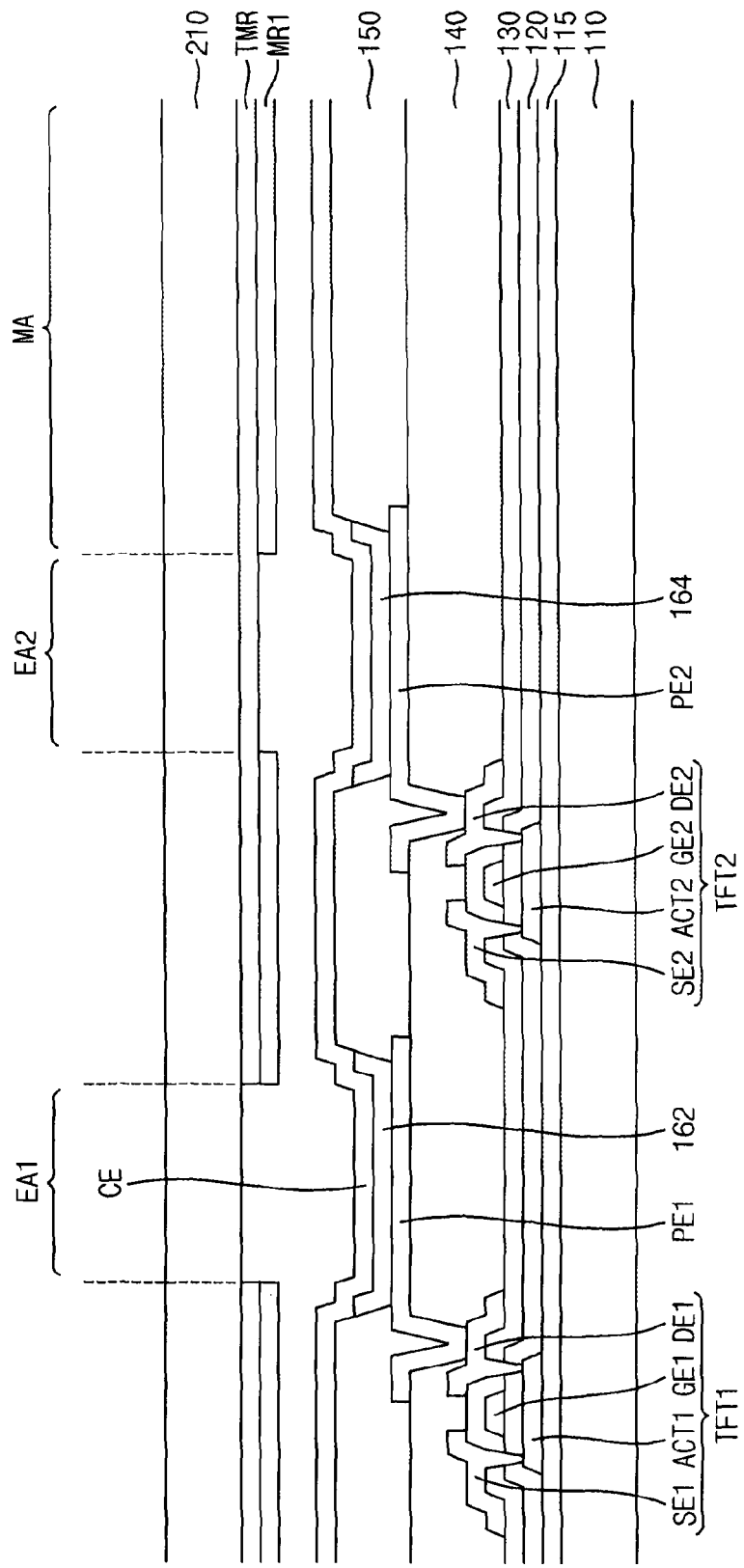
FIG. 8 is a cross-sectional view illustrating an organic light emitting display panel according to an exemplary embodiment of the inventive concept.

FIG. 8 is a cross-sectional view illustrating an organic light emitting display panel according to an exemplary embodiment of the inventive concept.

Referring to FIG. 8, the organic light emitting display panel is substantially same as the organic light emitting display panel of FIG. 4 except for a thin mirror layer TMR and a first mirror layer MR1. Thus, any further detailed descriptions concerning the same elements will be briefly described or omitted.

The organic light emitting display panel may include a first base substrate 110, a buffer layer 115, a first insulation layer 120, a first thin film transistor TFT1, a second thin film transistor TFT2, a second insulation layer 130, a planarization layer 140, a first pixel electrode PE1, a second pixel electrode PE2, a pixel defining layer 150, a first light emitting structure 162, a second light emitting structure 164, an opposite electrode CE, a thin film mirror layer TMR, a first mirror layer MR1, and a second base substrate 210.

The first base substrate 110 may include a transparent insulation substrate. The buffer layer 115 may be disposed on the first base substrate 110. The first active pattern ACT1 and the second active pattern ACT2 may be disposed on the buffer layer 115. The first insulation layer 120 may be disposed on the first base substrate 110 on which the first and second active patterns ACT1 and ACT2 are disposed. A gate pattern may be disposed on the first insulation layer 120. The gate pattern may include first and second gate electrode GE1 and GE2 which respectively overlap the first and second active pattern ACT1 and ACT2, signal lines to transmit signals for driving the pixel such as a gate line, and a first storage electrode. The second insulation layer 130 may be disposed on the first insulation layer 120 on which the gate pattern is disposed. A data pattern may be disposed on the second insulation layer 130. The data pattern may include the first and second source electrodes SE1 and SE1, the first and second drain electrodes DE1 and DE2, a signal line to transmit driving signal for the pixel such as a data line and a second storage electrode. The first active pattern ACT1, the first gate electrode GE1, the first drain electrode DE1 and the first source electrode SE1 may be included in the first thin film transistor TFT1. The second active pattern ACT2, the second gate electrode GE2, the second drain electrode DE2 and the second source electrode SE2 may be included in the second thin film transistor TFT2. The planarization layer 140 may be disposed on the second insulation layer 130 in which the first and second thin film transistors TFT1 and TFT2 are disposed.

The first pixel electrode PE1 may be disposed on the planarization layer 140. The second pixel electrode PE2 may be disposed on the planarization layer 140. The pixel defining layer 150 may be disposed on the planarization layer 140 on which the first and second pixel electrodes PE1 and PE2 are formed. The first light emitting structure 162 may be disposed on the first pixel electrode PE1 exposed by the opening of the pixel defining layer 150. The second light emitting structure 164 may be disposed on the second pixel electrode PE2 exposed by the opening of the pixel defining layer 150. The opposite electrode CE may be disposed on the first and second light emitting structures 162 and 164 and the pixel defining layer 150.

The second base substrate 210 may be disposed on the opposite electrode CE. The second base substrate 210 may include a glass substrate, a quartz substrate, a transparent resin substrate, etc.

In example embodiments, a predetermined space may be provided between the opposite electrode CE and the second base substrate 120. This space may be filled with an air or an inactive gas such as a nitrogen (N$_2$) gas. In some example embodiments, a protection layer (not illustrated) may be additionally disposed between the opposite electrode CE and the second base substrate 210. Here, the protection layer may include a resin, for example, photoresist, acryl-based resin, polyimide-based resin, polyamide-based resin, siloxane-based resin, etc.

The thin mirror layer TMR may be disposed on the second base substrate 210. The thin mirror layer TMR may be formed in a second light emitting area EA2 and a mirror area MA. The thin mirror layer TMR may define an opening in a first light emitting area EA1. The thin mirror layer TMR may include metal.

The first mirror layer MR1 may be disposed on the thin mirror layer TMR. The first mirror layer MR1 may define openings corresponding to the first light emitting area EA1 and the second emitting area EA2. The first mirror layer MR1 may include a material having high reflectivity such as metal to reflect external light. For example, the first mirror layer MR1 may include aluminum (Al), chrome (Cr), silver (Ag), iron (Fe), platinum (Pt), mercury (Hg), nickel (Ni), tungsten (W), vanadium (V), molybdenum (Mo) and etc. In some example embodiment, the first mirror layer MR1 may have multi layer structure having transparent conductive metal oxide layer and metal layer. For example, the first mirror layer MR1 may include ITO/Ag/ITO triple layers.

The thin mirror layer TMR may include a material which is same as that of the first mirror layer MR1 or different from that of the first mirror layer MR1. Thickness of the thin mirror layer TMR may be smaller than thickness of the first mirror layer MR1. The thin mirror layer TMR may partially reflect and partially transmit external light in the second light emitting area EA2. Thus, the thin mirror layer TMR may be a transflective film. The thin mirror layer TMR may include metal such as aluminum (Al), chrome (Cr), silver (Ag), iron (Fe), platinum (Pt), mercury (Hg), nickel (Ni), tungsten (W), vanadium (V), molybdenum (Mo) and etc. In some example embodiment, the thin mirror layer TMR may have multi layer structure having transparent conductive metal oxide layer and metal layer. For example, the thin mirror layer TMR may include ITO/Ag/ITO triple layers.

Figure 9:
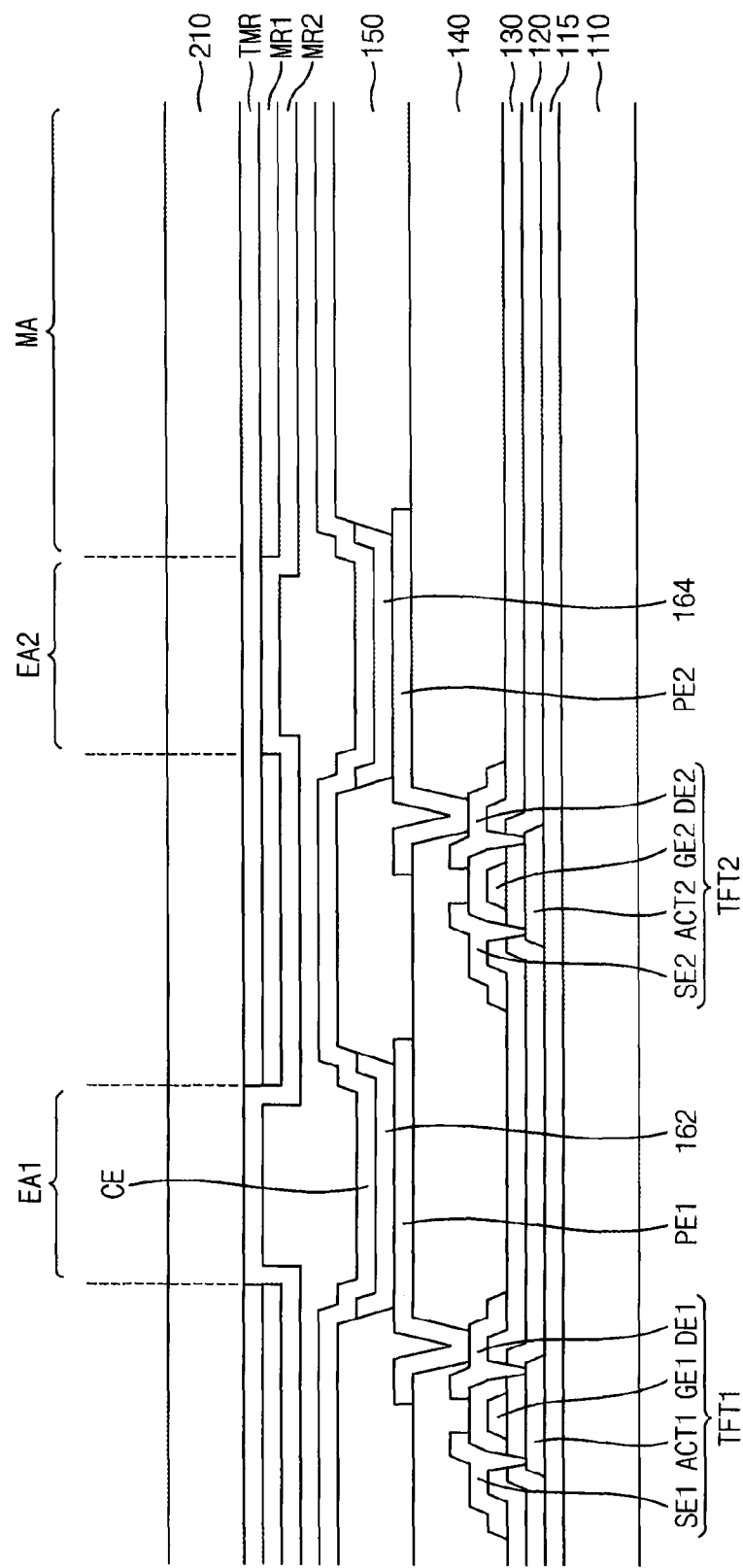
FIG. 9 is a cross-sectional view illustrating an organic light emitting display panel according to an exemplary embodiment of the inventive concept.

FIG. 9 is a cross-sectional view illustrating an organic light emitting display panel according to an exemplary embodiment of the inventive concept.

Referring to FIG. 9, the organic light emitting display panel is substantially the same as the organic light emitting display panel of FIG. 5 except for a second mirror layer MR2. Thus, any further detailed descriptions concerning the same elements will be briefly described or omitted.

The organic light emitting display panel may include a first base substrate 110, a buffer layer 115, a first insulation layer 120, a first thin film transistor TFT1, a second thin film transistor TFT2, a second insulation layer 130, a planarization layer 140, a first pixel electrode PE1, a second pixel electrode PE2, a pixel defining layer 150, a first light emitting structure 162, a second light emitting structure 164, an opposite electrode CE, a thin film mirror layer TMR, a first mirror layer MR1, a second mirror layer MR2, and a second base substrate 210.

The first base substrate 110 may include a transparent insulation substrate. The buffer layer 115 may be disposed on the first base substrate 110. The first active pattern ACT1 and the second active pattern ACT2 may be disposed on the buffer layer 115. The first insulation layer 120 may be disposed on the first base substrate 110 on which the first and second active patterns ACT1 and ACT2 are disposed. A gate pattern may be disposed on the first insulation layer 120. The gate pattern may include first and second gate electrode GE1 and GE2 which respectively overlap the first and second active pattern ACT1 and ACT2, signal lines to transmit signals for driving the pixel such as a gate line, and a first storage electrode. The second insulation layer 130 may be disposed on the first insulation layer 120 on which the gate pattern is disposed. A data pattern may be disposed on the second insulation layer 130. The data pattern may include the first and second source electrodes SE1 and SE1, the first and second drain electrodes DE1 and DE2, a signal line to transmit driving signal for the pixel such as a data line and a second storage electrode. The first active pattern ACT1, the first gate electrode GE1, the first drain electrode DE1 and the first source electrode SE1 may be included in the first thin film transistor TFT1. The second active pattern ACT2, the second gate electrode GE2, the second drain electrode DE2 and the second source electrode SE2 may be included in the second thin film transistor TFT2. The planarization layer 140 may be disposed on the second insulation layer 130 in which the first and second thin film transistors TFT1 and TFT2 are disposed.

The first pixel electrode PE1 may be disposed on the planarization layer 140. The second pixel electrode PE2 may be disposed on the planarization layer 140. The pixel defining layer 150 may be disposed on the planarization layer 140 on which the first and second pixel electrodes PE1 and PE2 are formed. The first light emitting structure 162 may be disposed on the first pixel electrode PE1 exposed by the opening of the pixel defining layer 150. The second light emitting structure 164 may be disposed on the second pixel electrode PE2 exposed by the opening of the pixel defining layer 150. The opposite electrode CE may be disposed on the first and second light emitting structures 162 and 164 and the pixel defining layer 150.

The second base substrate 210 may be disposed on the opposite electrode CE. The second base substrate 210 may include a glass substrate, a quartz substrate, a transparent resin substrate, etc.

In example embodiments, a predetermined space may be provided between the opposite electrode CE and the second base substrate 120. This space may be filled with an air or an inactive gas such as a nitrogen (N$_2$) gas. In some example embodiments, a protection layer (not illustrated) may be additionally disposed between the opposite electrode CE and the second base substrate 210. Here, the protection layer may include a resin, for example, photoresist, acryl-based resin, polyimide-based resin, polyamide-based resin, siloxane-based resin, etc.

The thin mirror layer TMR may be disposed on the second base substrate 210. The thin mirror layer TMR may be formed in a second light emitting area EA2 and a mirror area MA. The thin mirror layer TMR may define an opening in a first light emitting area EA1. The thin mirror layer TMR may include metal.

The first mirror layer MR1 may be disposed on the thin mirror layer TMR. The first mirror layer MR1 may define openings corresponding to the first light emitting area EA1 and the second emitting area EA2. The first mirror layer MR1 may include a material having high reflectivity such as metal to reflect external light. For example, the first mirror layer MR1 may include aluminum (Al), chrome (Cr), silver (Ag), iron (Fe), platinum (Pt), mercury (Hg), nickel (Ni), tungsten (W), vanadium (V), molybdenum (Mo) and etc. In some example embodiment, the first mirror layer MR1 may have multi layer structure having transparent conductive metal oxide layer and metal layer. For example, the first mirror layer MR1 may include ITO/Ag/ITO triple layers.

The second mirror layer MR2 may be disposed on the second base substrate 210 on which the thin mirror layer TMR and the first mirror layer MR1 are disposed. The second mirror layer MR2 may be formed in entire of the first light emitting area EA1, the second light emitting area EA2 and the mirror area MA. The second mirror layer MR2 may include a material which is the same as that of the first mirror layer MR1 or different from that of the first mirror layer MR1. Thickness of the second mirror layer MR2 may be smaller than thickness of the first mirror layer MR1. The second mirror layer MR2 may partially reflect and partially transmit external light in the first and second light emitting areas EA1 and EA2. The second mirror layer MR2 may include a material having high reflectivity such as metal to reflect external light. For example, the second mirror layer MR2 may include aluminum (Al), chrome (Cr), silver (Ag), iron (Fe), platinum (Pt), mercury (Hg), nickel (Ni), tungsten (W), vanadium (V), molybdenum (Mo) and etc. In some example embodiment, the first mirror layer MR1 may have multi layer structure having transparent conductive metal oxide layer and metal layer. For example, the second mirror layer MR2 may include ITO/Ag/ITO triple layers.

The thin mirror layer TMR may include a material which is the same as that of the first mirror layer MR1 and/or the second mirror layer MR2 or different from that of the first mirror layer MR1 and/or the second mirror layer MR2. Thickness of the thin mirror layer TMR may be smaller than thickness of the first mirror layer MR1 and thickness of the second mirror layer MR2. The thin mirror layer TMR may partially reflect and partially transmit external light in the second light emitting area EA2. Thus, the thin mirror layer TMR may be a transflective film. The thin mirror layer TMR may include metal such as aluminum (Al), chrome (Cr), silver (Ag), iron (Fe), platinum (Pt), mercury (Hg), nickel (Ni), tungsten (W), vanadium (V), molybdenum (Mo) and etc. In some example embodiment, the thin mirror layer TMR may have multi layer structure having transparent conductive metal oxide layer and metal layer. For example, the thin mirror layer TMR may include ITO/Ag/ITO triple layers.

Figure 10:
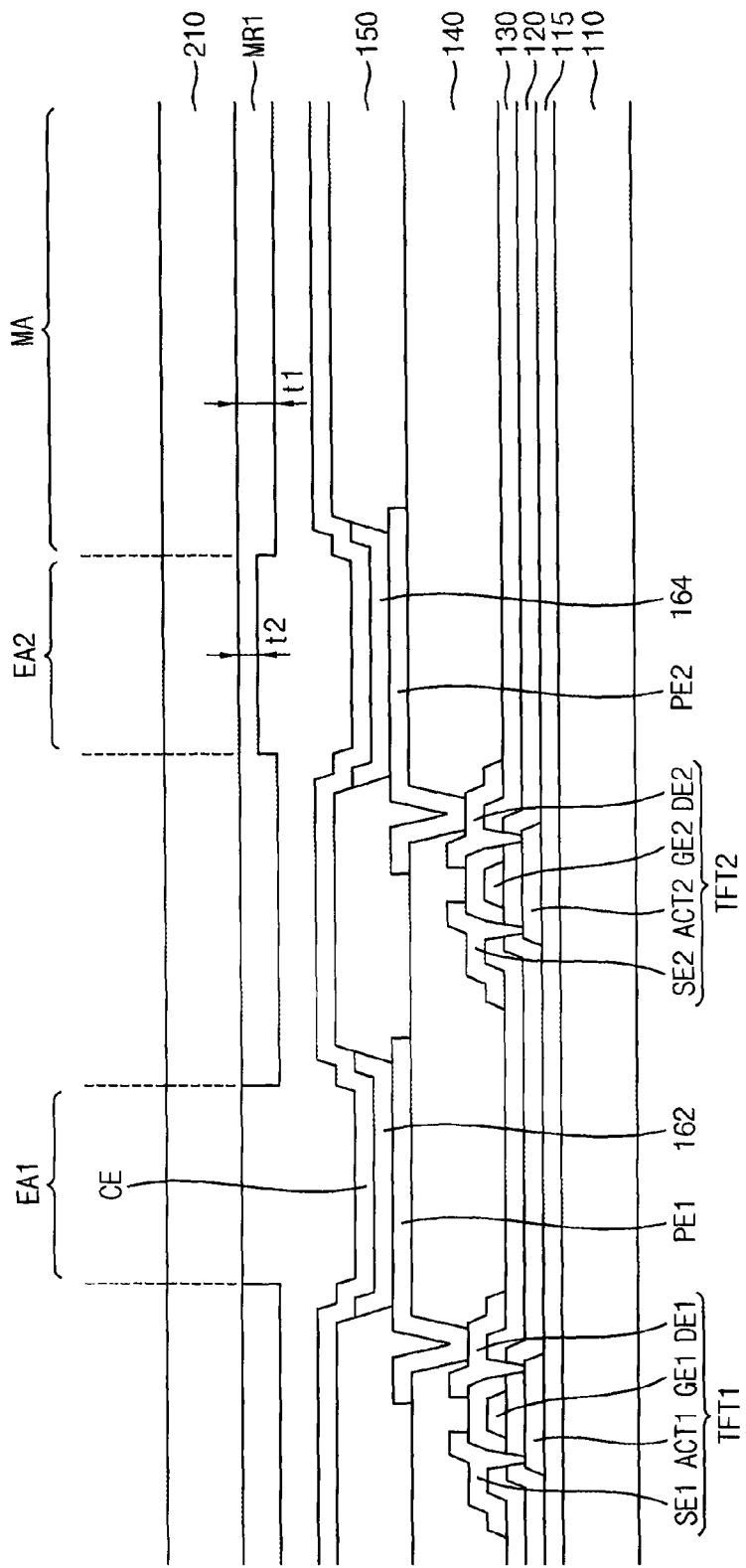
FIG. 10 is a cross-sectional view illustrating an organic light emitting display panel according to an exemplary embodiment of the inventive concept.

FIG. 10 is a cross-sectional view illustrating an organic light emitting display panel according to an exemplary embodiment of the inventive concept.

Referring to FIG. 10, the organic light emitting display panel is substantially the same as the organic light emitting display panel of FIG. 4, except for a first mirror layer MR1. Thus, any further detailed descriptions concerning the same elements will be briefly described or omitted.

The organic light emitting display panel may include a first base substrate 110, a buffer layer 115, a first insulation layer 120, a first thin film transistor TFT1, a second thin film transistor TFT2, a second insulation layer 130, a planarization layer 140, a first pixel electrode PE1, a second pixel electrode PE2, a pixel defining layer 150, a first light emitting structure 162, a second light emitting structure 164, an opposite electrode CE, a first mirror layer MR1, and a second base substrate 210.

The first base substrate 110 may include a transparent insulation substrate. The buffer layer 115 may be disposed on the first base substrate 110. The first active pattern ACT1 and the second active pattern ACT2 may be disposed on the buffer layer 115. The first insulation layer 120 may be disposed on the first base substrate 110 on which the first and second active patterns ACT1 and ACT2 are disposed. A gate pattern may be disposed on the first insulation layer 120. The gate pattern may include first and second gate electrode GE1 and GE2 which respectively overlap the first and second active pattern ACT1 and ACT2, signal lines to transmit signals for driving the pixel such as a gate line, and a first storage electrode. The second insulation layer 130 may be disposed on the first insulation layer 120 on which the gate pattern is disposed. A data pattern may be disposed on the second insulation layer 130. The data pattern may include the first and second source electrodes SE1 and SE1, the first and second drain electrodes DE1 and DE2, a signal line to transmit driving signal for the pixel such as a data line and a second storage electrode. The first active pattern ACT1, the first gate electrode GE1, the first drain electrode DE1 and the first source electrode SE1 may be included in the first thin film transistor TFT1. The second active pattern ACT2, the second gate electrode GE2, the second drain electrode DE2 and the second source electrode SE2 may be included in the second thin film transistor TFT2. The planarization layer 140 may be disposed on the second insulation layer 130 in which the first and second thin film transistors TFT1 and TFT2 are disposed.

The first pixel electrode PE1 may be disposed on the planarization layer 140. The second pixel electrode PE2 may be disposed on the planarization layer 140. The pixel defining layer 150 may be disposed on the planarization layer 140 on which the first and second pixel electrodes PE1 and PE2 are formed. The first light emitting structure 162 may be disposed on the first pixel electrode PE1 exposed by the opening of the pixel defining layer 150. The second light emitting structure 164 may be disposed on the second pixel electrode PE2 exposed by the opening of the pixel defining layer 150. The opposite electrode CE may be disposed on the first and second light emitting structures 162 and 164 and the pixel defining layer 150.

The second base substrate 210 may be disposed on the opposite electrode CE. The second base substrate 210 may include a glass substrate, a quartz substrate, a transparent resin substrate, etc. Examples of the transparent resin substrate for the second base substrate 210 may include polyimide-based resin, acryl-based resin, polyacrylate-based resin, polycarbonate-based resin, polyether-based resin, sulfonic acid containing resin, polyethyleneterephthalate-based resin, etc.

In example embodiments, a predetermined space may be provided between the opposite electrode CE and the second base substrate 120. This space may be filled with an air or an inactive gas such as a nitrogen ($N_2$) gas. In some example embodiments, a protection layer (not illustrated) may be additionally disposed between the opposite electrode CE and the second base substrate 210. Here, the protection layer may include a resin, for example, photoresist, acryl-based resin, polyimide-based resin, polyamide-based resin, siloxane-based resin, etc.

The first mirror layer MR1 may be disposed on the second base substrate 210. The first mirror layer MR1 may define openings corresponding to a first light emitting area EA1 and include a portion having smaller thickness than the mirror area corresponding to a second emitting area EA2. The first mirror layer MR1 may include a material having high reflectivity such as metal to reflect external light. For example, the first mirror layer MR1 may include aluminum (Al), chrome (Cr), silver (Ag), iron (Fe), platinum (Pt), mercury (Hg), nickel (Ni), tungsten (W), vanadium (V), molybdenum (Mo) and etc.

The first mirror layer MR1 may have a first thickness t1 in a mirror area MA, and have a second thickness t2 in the second light emitting area EA2. The second thickness t2 may be smaller than the first thickness t1. Thus, the first mirror layer MR1 may fully reflect external light in the mirror area MA, and may partially reflect and partially transmit the external light in the second light emitting area EA2. Thus, the first mirror layer MR1 may perform as a transflective film.

Figure 11:
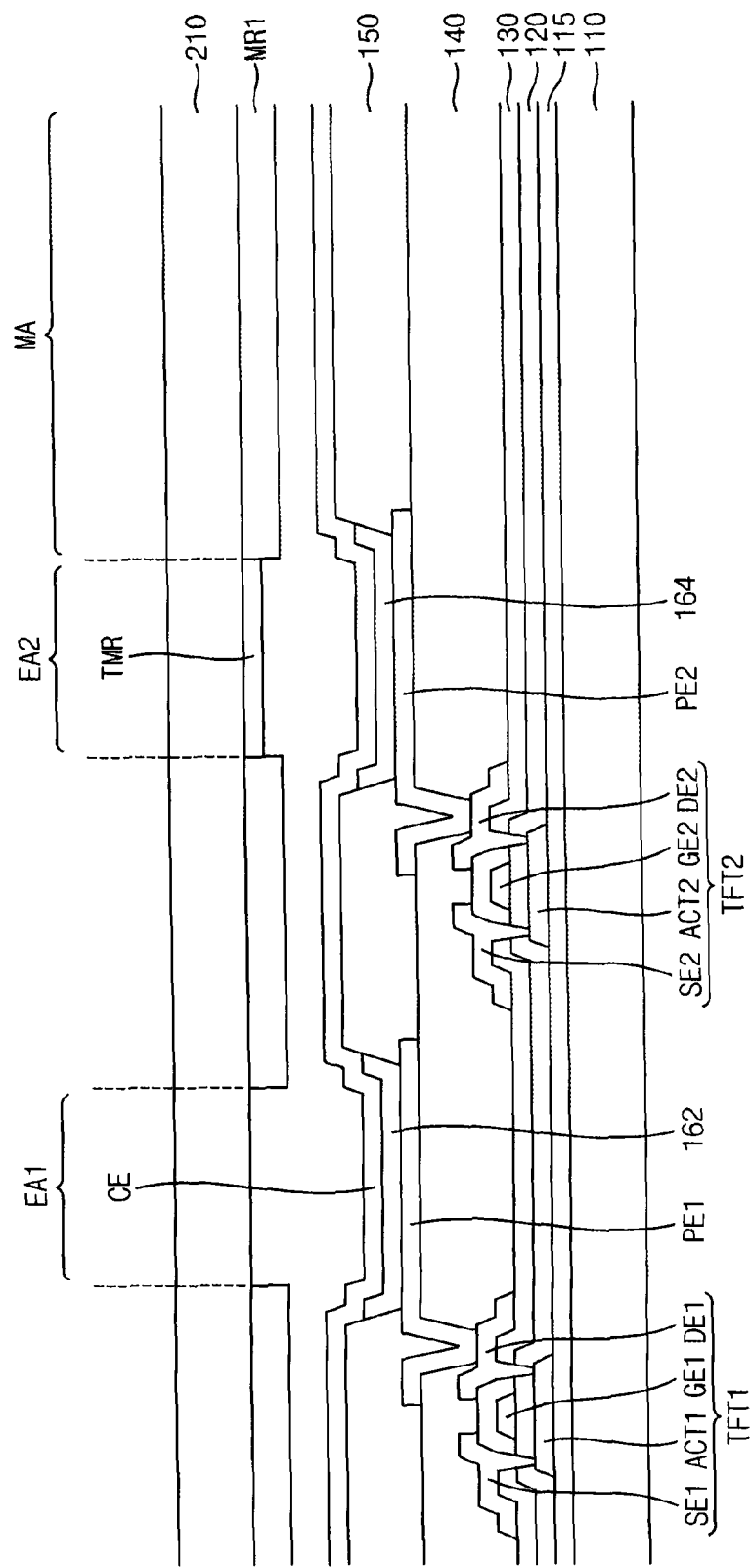
FIG. 11 is a cross-sectional view illustrating an organic light emitting display panel according to an exemplary embodiment of the inventive concept.

FIG. 11 is a cross-sectional view illustrating an organic light emitting display panel according to an exemplary embodiment of the inventive concept.

Referring to FIG. 11, the organic light emitting display panel is substantially the same as the organic light emitting display panel of FIG. 4, except for a first mirror layer MR1 and a thin film mirror TMR. Thus, any further detailed descriptions concerning the same elements will be briefly described or omitted.

The organic light emitting display panel may include a first base substrate 110, a buffer layer 115, a first insulation layer 120, a first thin film transistor TFT1, a second thin film transistor TFT2, a second insulation layer 130, a planarization layer 140, a first pixel electrode PE1, a second pixel electrode PE2, a pixel defining layer 150, a first light emitting structure 162, a second light emitting structure 164, an opposite electrode CE, a first mirror layer MR1, a thin film mirror layer TMR and a second base substrate 210.

The first base substrate 110 may include a transparent insulation substrate. The buffer layer 115 may be disposed on the first base substrate 110. The first active pattern ACT1 and the second active pattern ACT2 may be disposed on the buffer layer 115. The first insulation layer 120 may be disposed on the first base substrate 110 on which the first and second active patterns ACT1 and ACT2 are disposed. A gate pattern may be disposed on the first insulation layer 120. The gate pattern may include first and second gate electrode GE1 and GE2 which respectively overlap the first and second active pattern ACT1 and ACT2, signal lines to transmit signals for driving the pixel such as a gate line, and a first storage electrode. The second insulation layer 130 may be disposed on the first insulation layer 120 on which the gate pattern is disposed. A data pattern may be disposed on the second insulation layer 130. The data pattern may include the first and second source electrodes SE1 and SE1, the first and second drain electrodes DE1 and DE2, a signal line to transmit driving signal for the pixel such as a data line and a second storage electrode. The first active pattern ACT1, the first gate electrode GE1, the first drain electrode DE1 and the first source electrode SE1 may be included in the first thin film transistor TFT1. The second active pattern ACT2, the second gate electrode GE2, the second drain electrode DE2 and the second source electrode SE2 may be included in the second thin film transistor TFT2. The planarization layer 140 may be disposed on the second insulation layer 130 in which the first and second thin film transistors TFT1 and TFT2 are disposed.

The first pixel electrode PE1 may be disposed on the planarization layer 140. The second pixel electrode PE2 may be disposed on the planarization layer 140. The pixel defining layer 150 may be disposed on the planarization layer 140 on which the first and second pixel electrodes PE1 and PE2 are formed. The first light emitting structure 162 may be disposed on the first pixel electrode PE1 exposed by the opening of the pixel defining layer 150. The second light emitting structure 164 may be disposed on the second pixel electrode PE2 exposed by the opening of the pixel defining layer 150. The opposite electrode CE may be disposed on the first and second light emitting structures 162 and 164 and the pixel defining layer 150.

The second base substrate 210 may be disposed on the opposite electrode CE. The second base substrate 210 may include a glass substrate, a quartz substrate, a transparent resin substrate, etc. Examples of the transparent resin substrate for the second base substrate 210 may include polyimide-based resin, acryl-based resin, polyacrylate-based resin, polycarbonate-based resin, polyether-based resin, sulfonic acid containing resin, polyethyleneterephthalate-based resin, etc.

In example embodiments, a predetermined space may be provided between the opposite electrode CE and the second base substrate 120. This space may be filled with an air or an inactive gas such as a nitrogen ($N_2$) gas. In some example embodiments, a protection layer (not illustrated) may be additionally disposed between the opposite electrode CE and the second base substrate 210. Here, the protection layer may include a resin, for example, photoresist, acryl-based resin, polyimide-based resin, polyamide-based resin, siloxane-based resin, etc.

The first mirror layer MR1 may be disposed on the second base substrate 210. The first mirror layer MR1 may define openings corresponding to a first light emitting area EA1 and a second emitting area EA2. The first mirror layer MR1 may include a material having high reflectivity such as metal to reflect external light. For example, the first mirror layer MR1 may include aluminum (Al), chrome (Cr), silver (Ag), iron (Fe), platinum (Pt), mercury (Hg), nickel (Ni), tungsten (W), vanadium (V), molybdenum (Mo) and etc. In some example embodiment, the first mirror layer MR1 may have multi layer structure having transparent conductive metal oxide layer and metal layer. For example, the first mirror layer MR1 may include ITO/Ag/ITO triple layers.

The thin mirror layer TMR may be disposed in the second light emitting area EA1 on the second substrate 210. The thin mirror layer TMR may include a material which is the same as that of the first mirror layer MR1 or different from that of the first mirror layer MR1. Thickness of the thin mirror layer TMR may be smaller than thickness of the first mirror layer MR1. The thin mirror layer TMR may partially reflect and partially transmit external light in the second light emitting area EA2. Thus, the thin mirror layer TMR may be a transflective film. The thin mirror layer TMR may include metal such as aluminum (Al), chrome (Cr), silver (Ag), iron (Fe), platinum (Pt), mercury (Hg), nickel (Ni), tungsten (W), vanadium (V), molybdenum (Mo) and etc. In some example embodiment, the thin mirror layer TMR may have multi layer structure having transparent conductive metal oxide layer and metal layer. For example, the thin mirror layer TMR may include ITO/Ag/ITO triple layers.

According to the example embodiments, the organic light emitting display apparatus includes a first mirror layer, first to third pixels and first to third auxiliary pixels. Auxiliary scan signals which control on/off of the first to third pixels may be applied to the first to third auxiliary pixels.

For example, in a first mode, the first to third pixels of the organic light emitting display apparatus may emit light. In a second mode, the first to third pixels and the first to third auxiliary pixels of organic light emitting display apparatus may emit light.

The organic light emitting display apparatus may be driven by the first mode or the second mode as required. For example, when external light is weaker than predetermined reference, the organic light emitting display apparatus may be driven by the first mode. When the external light is stronger than the predetermined reference, the organic light emitting display apparatus may be driven by the second mode.

Accordingly, the organic light emitting display apparatus may perform mirror function and display function. The auxiliary pixel may be turn on/off according to strength of the external light, so that display quality may be improved.

In addition, the pixels and the auxiliary pixels may emit light at the same time, so that current level of each of organic light emitting elements may be reduced in consideration of amount of light emitted. Thus, life of the organic light emitting display apparatus may be improved.

FIGS. 12A to 12G are cross-sectional views illustrating a method of manufacturing the organic light emitting display panel of FIG. 4.

Figure 12A:
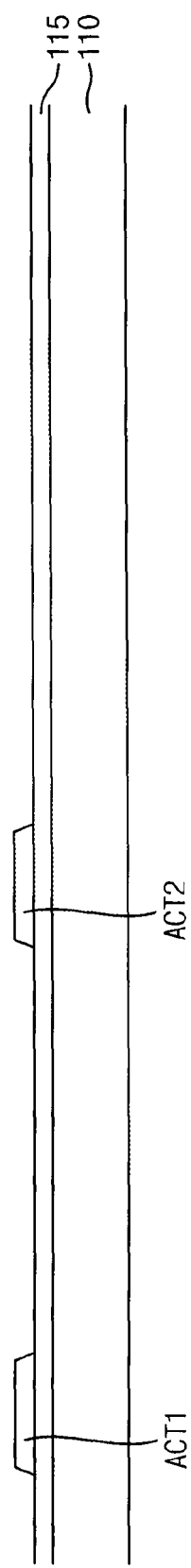

Referring to FIG. 12A, a buffer layer 115 may be formed on a first base substrate 110. The buffer layer 115 may be formed by a spin coating process, a chemical vapor deposition (CVD) process, a plasma enhanced chemical vapor deposition (PECVD) process, a high density plasma-chemical vapor deposition (HDP-CVD) process, a printing process, etc.

A first active pattern ACT1 and a second active pattern ACT2 may be formed on the buffer layer 115.

A semiconductor layer (not illustrated) may be formed on the buffer layer 115, and then a preliminary active layer (not illustrated) may be formed on the buffer layer 115 by patterning the semiconductor layer. The crystallization process may be performed to the preliminary active layer to form the first and second active pattern ACT1 and ACT2 on the buffer layer 115. Here, the semiconductor layer may be formed by a CVD process, a PECVD process, a low pressure chemical vapor deposition (LPCVD) process, a sputtering process, a printing process, etc. When the semiconductor layer includes amorphous silicon, the first and second active patterns ACT1 and ACT2 may include polysilicon. The crystallization process for forming the first and second active patterns ACT1 and ACT2 may include a laser irradiation process, a thermal treatment process, a thermal process utilizing a catalyst, etc. In some example embodiments, a dehydrogenation process may be performed to the semiconductor layer and/or the preliminary active layer after forming the semiconductor layer and/or the preliminary active layer on the buffer layer 115. The dehydrogenation process may reduce the hydrogen concentration of the semiconductor layer and/or the preliminary active layer, so that the first and second active pattern ACT1 and ACT2 may have improved electrical characteristics.

Referring to FIG. 12B, a first insulation layer 120 may be formed on the buffer layer 115 on which the first and second active patterns ACT1 and ACT2 are formed.

The first insulation layer 120 may be formed by a CVD process, a spin coating process, a PECVD process, a sputtering process, a vacuum evaporation process, an HDP-CVD process, a printing process, etc.

A gate pattern including first and second gate electrodes GE1 and GE2 may be formed on the first insulation layer 120.

A first conductive layer (not shown) may be formed on the first insulation layer 120, and then the first conductive layer may be patterned by a photolithography process using a mask. Hence, the gate pattern may be provided on the first insulation layer 120.

Figure 12C:
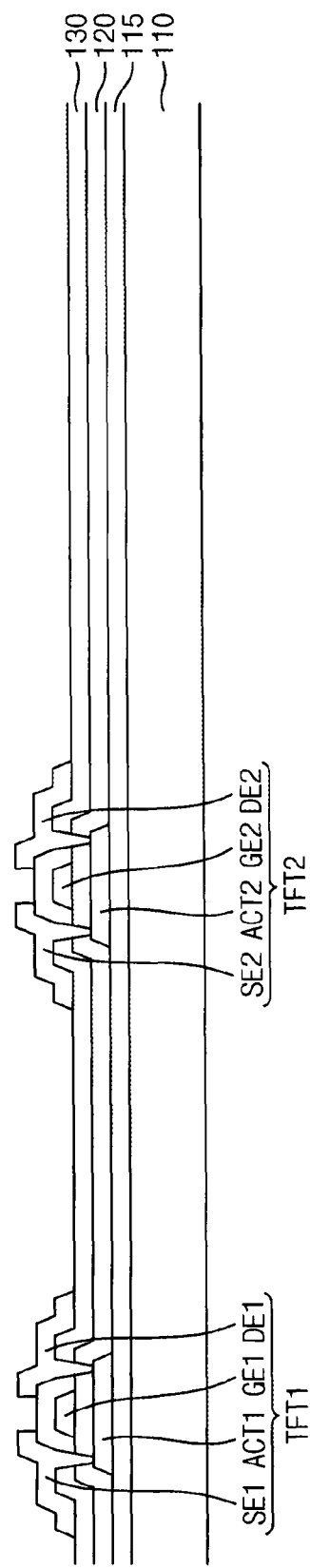

Referring to FIG. 12C, a second insulation layer 130 may be formed on the first insulation layer 120 on which the gate pattern is formed.

The second insulation layer 130 may be formed by a CVD process, a spin coating process, a PECVD process, a sputtering process, a vacuum evaporation process, an HDP-CVD process, a printing process, etc.

A data pattern including a first source electrode SE1, a first drain electrode DE1, a second source electrode SE2 and a second drain electrode DE2 may be formed on the second insulation layer 130.

Contact holes respectively exposing the first and second active patterns ACT1 and ACT2 may be formed by partially etching the second insulation layer 130 and the first insulation layer 120. A second conductive layer (not shown) may be formed on the second insulation layer 130 to fill the contact holes, and then the second conductive layer may be patterned by a photolithography process using an additional mask. Hence, the data pattern may be provided.

Figure 12D:
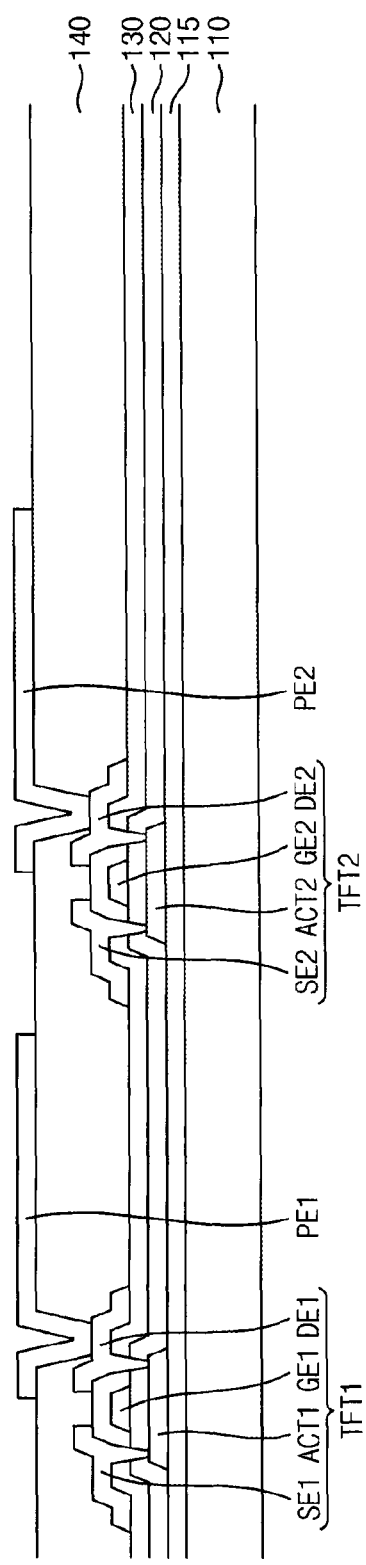
Figure 12E:
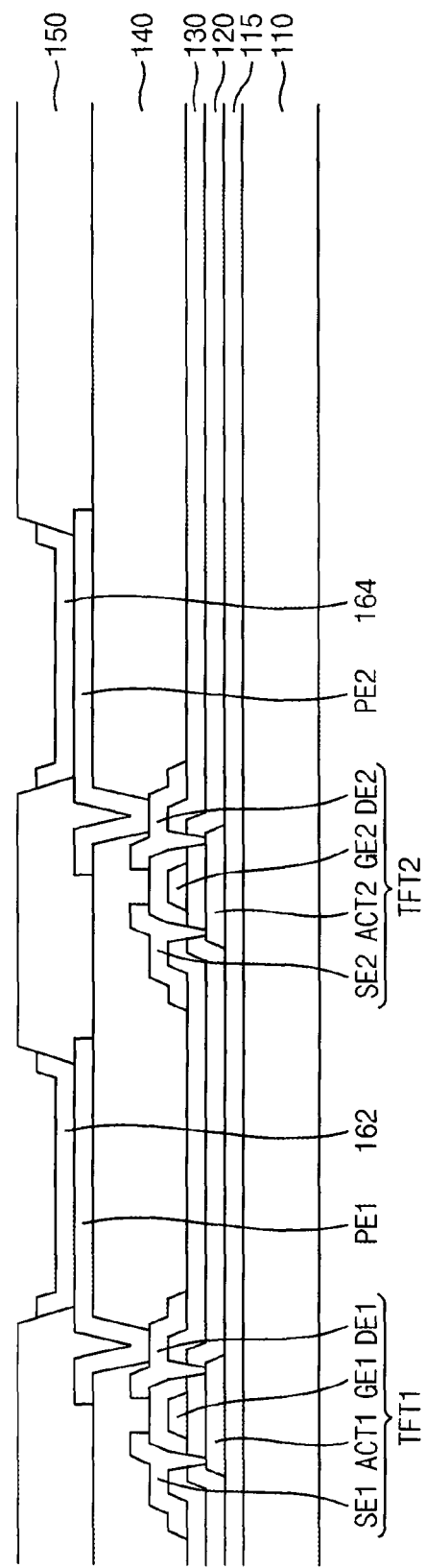

Referring to FIG. 12D, a planarization layer 140 may be formed on the second insulation layer 130 on which the data pattern is formed.

The planarization layer 140 may be formed by a spin coating process, a printing process, a sputtering process, a CVD process, an ALD process, a PECVD process, an HDP-CVD process or a vacuum evaporation process in accordance with ingredients included in the planarization layer 140.

In example embodiments, when a surface of the planarization layer 140 has an uneven surface, a planarization process may be performed to flatten the surface of the planarization layer 140. For example, the planarization layer 140 may have a substantially flat surface by a chemical mechanical polishing (CMP) process, an etch-back process, etc.

A first pixel electrode PE1 and a second pixel electrode PE2 may be formed on the planarization layer 140.

The planarization layer 140 may be partially removed. When the planarization layer 140 is a photoresist layer, the photoresist layer is exposed using a mask and the planarization layer 140 on the first drain electrode DE1 and the second drain electrode DE2 may be developed to form contact holes exposing the first drain electrode DE1 and the second drain electrode DE2. When the planarization layer 140 is not a photoresist layer, a photolithography process is performed to form the first contact hole and the second contact hole through the planarization layer 140 exposing the first and second drain electrodes DE1 and DE2 of the first and second thin film transistors TFT1 and TFT2.

In example embodiments, the first and second contact holes may have a sidewall inclined by a predetermined angle relative to the first base substrate 110. For example, the first and second contact holes may have an upper width substantially larger than a lower width thereof.

The first pixel electrode PE1 may be formed on the planarization layer 140 to be electrically connected to the first drain electrode DE1 through the first contact hole. The first pixel electrode PE1 may make contact to the first drain electrode DE1 which is exposed by the first contact hole. The first pixel electrode PE1 may be disposed corresponding to a first light emitting area EA1.

The second pixel electrode PE2 may be formed on the planarization layer 140 to be electrically connected to the first drain electrode DE2 through the second contact hole. The second pixel electrode PE2 may make contact to the second drain electrode DE2 which is exposed by the second contact hole. The second pixel electrode PE2 may be disposed corresponding to a second light emitting area EA2

For example, a pixel electrode layer may be formed on the planarization layer 140, and then the pixel electrode layer may be patterned by a photolithography process using an additional etching mask. Hence, the first pixel electrode PE1 and the second pixel electrode PE2 may be provided. The pixel electrode layer may be formed by a printing process, a sputtering process, a CVD process, an atomic layer deposition (ALD) process, a vacuum evaporation process, a pulsed laser deposition (PLD) process, and etc Referring to FIG. 12E, a pixel defining layer 150 may be formed on the planarization layer 140 on which the first and second pixel electrodes PE1 and PE2. The pixel defining layer 150 may be obtained by a spin coating process, a spray process, a printing process, a CVD process, etc. In some example embodiment, openings which partially expose the first and second pixel electrodes PE1 and PE2 may be formed by partially removing the pixel defining layer 150.

A first light emitting structure 162 and a second light emitting structure 164 may be formed on the first and second pixel electrodes PE1 and PE2, respectively.

The first light emitting structure 162 and the second light emitting structure 164 may be formed by a laser induced thermal imaging process, a printing process, etc. The first light emitting structure 162 and the second light emitting structure 164 may include the same material, so that the first light emitting structure 162 and the second light emitting structure 164 may emit light having the same color.

Figure 12F:
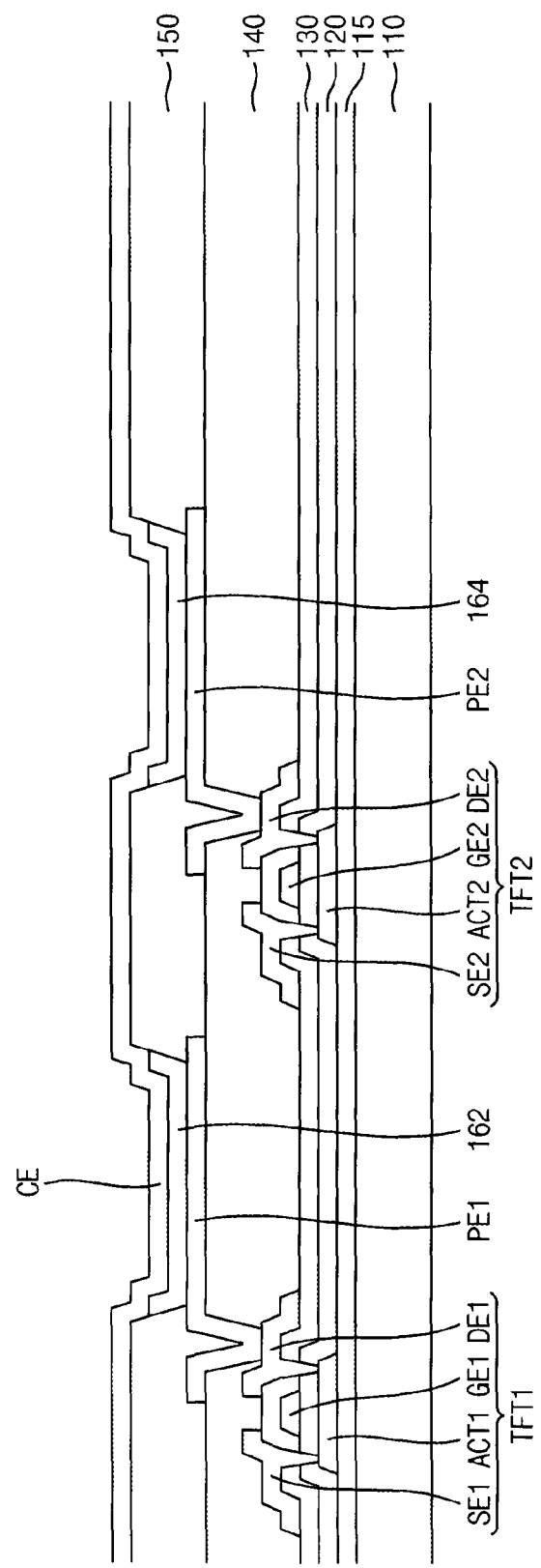

Referring to FIG. 12F, an opposite electrode CE may be formed on the first light emitting structure 162, the second light emitting structure 164 and the pixel defining layer 150. The opposite electrode CE may be formed by a printing process, a sputtering process, a CVD process, a PLD process, a vacuum evaporation process, an ALD process, etc. In some example embodiment, the opposite electrode CE may have a single layer structure or a multi layer structure including a metal layer, an alloy layer, metal nitride layer, a conductive metal oxide layer and/or transparent conductive layer.

Figure 12G:
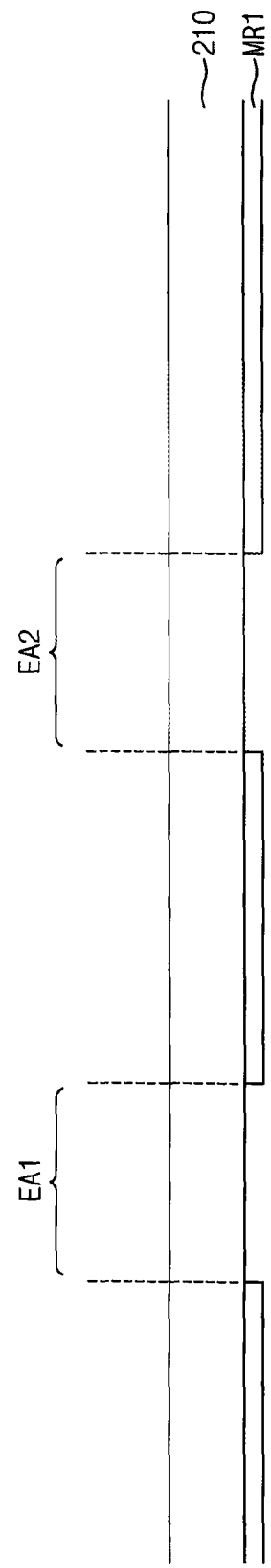

Referring to FIG. 12G a first mirror layer MR1 which defines openings corresponding to first and second light emitting areas EA1 and EA2 may be formed on the second base substrate 210. A metal layer may be formed on the second base substrate 210, and then the metal layer may be patterned by a photolithography process using an additional etching mask. Hence, the first mirror layer MR1 may be obtained.

And then, the second base substrate 210 on which the first mirror layer MR1 is formed may be located facing the first base substrate. Thus, the organic light emitting display apparatus may be manufactured.

Figure 13:
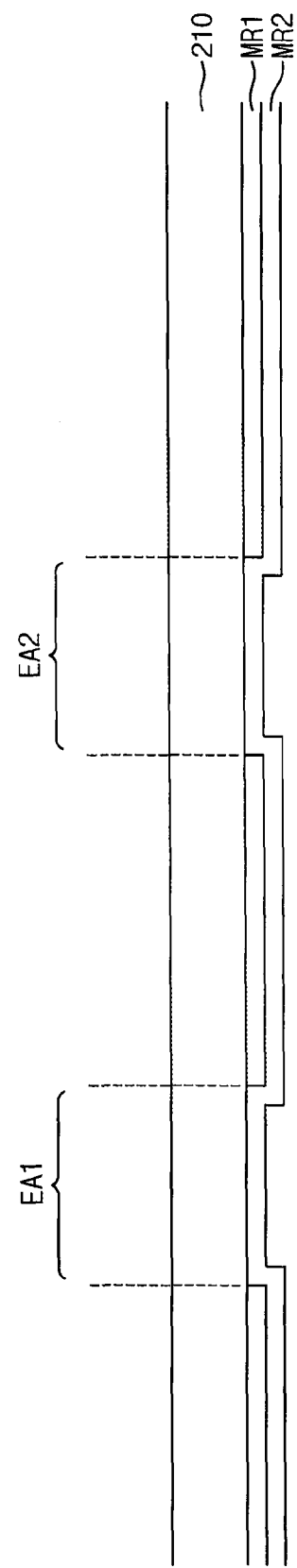
FIG. 13 is a cross-sectional views illustrating a method of manufacturing the organic light emitting display panel of FIG. 5.

FIG. 13 is a cross-sectional view illustrating a method of manufacturing the organic light emitting display panel of FIG. 5.

Referring to FIG. 13, a first mirror layer MR1 which defines openings corresponding to first and second light emitting areas EA1 and EA2 may be formed on the second base substrate 210. A metal layer may be formed on the second base substrate 210, and then the metal layer may be patterned by a photolithography process using an additional etching mask. Hence, the first mirror layer MR1 may be obtained.

A second mirror layer MR2 may be formed on the first mirror layer MR1. The second mirror layer MR2 may cover the first mirror layer MR1 and entire portion of the second substrate 210 where is exposed by the opening of the first mirror layer MR1.

And then, the second base substrate 210 on which the first mirror layer MR1 and the second mirror layer MR2 are formed may be located facing the first base substrate. Thus, the organic light emitting display apparatus may be manufactured.

Figure 14A:
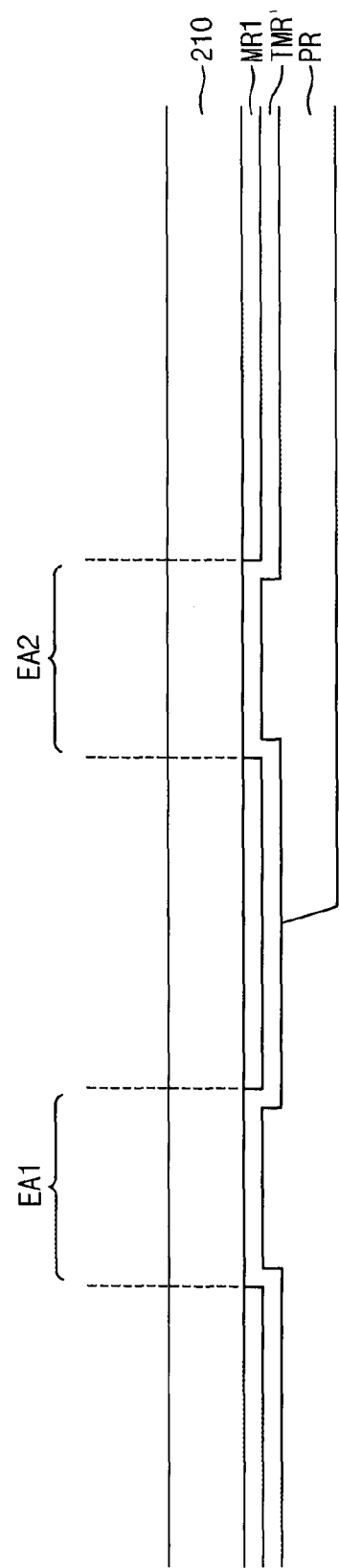
FIGS. 14A and 14B are cross-sectional views illustrating a method of manufacturing the organic light emitting display panel of FIG. 6.
Figure 14B:
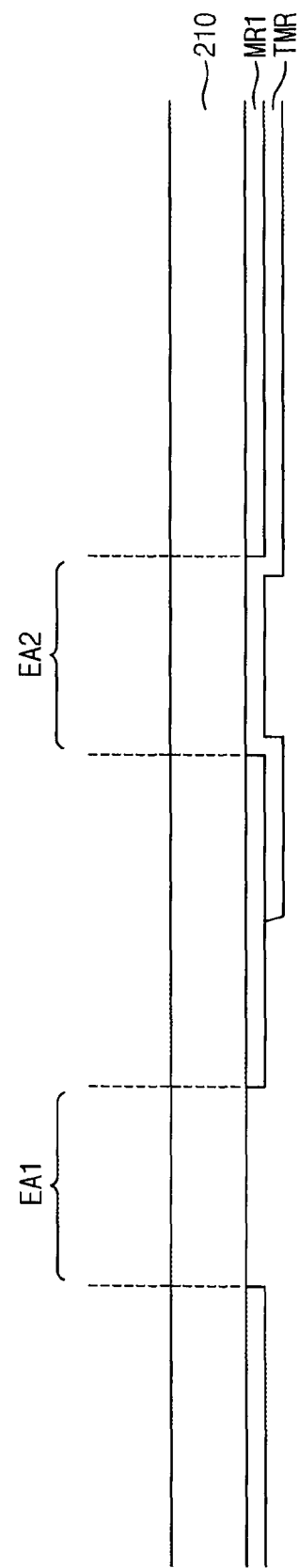

FIGS. 14A and 14B are cross-sectional views illustrating a method of manufacturing the organic light emitting display panel of FIG. 6.

Referring to FIG. 14A, a first mirror layer MR1 which defines openings corresponding to first and second light emitting areas EA1 and EA2 may be formed on the second substrate 210. A metal layer may be formed on the second base substrate 210, and then the metal layer may be patterned by a photolithography process using an additional etching mask. Hence, the first mirror layer MR1 may be obtained.

A preliminary thin film mirror layer TMR' may be formed on the first mirror layer MR1.

A photoresist pattern PR may be formed on the preliminary thin film mirror layer TMR'. The photoresist pattern PR may overlap the second light emitting area EA2 but not overlap the first light emitting area EA1. A photoresist layer may be formed on the preliminary thin film mirror layer TMR', and then the photoresist layer may be exposed using a mask and developed. Hence, the photoresist pattern PR may be formed.

Referring to FIG. 14B, using the photoresist pattern PR, the preliminary thin film mirror layer TMR' may be patterned into a thin film mirror layer TMR. For example, the preliminary thin film mirror layer TMR' may be dry etched using the photoresist pattern PR as an etch mask. The photoresist pattern PR may be removed after dry etching. Accordingly, the thin film mirror layer TMR may be formed on the second base substrate 210 in the second light emitting area EA2 and on a portion of the first mirror layer MR1.

And then, the second base substrate 210 on which the first mirror layer MR1 and the thin mirror layer TMR are formed may be located facing the first base substrate on which an opposite electrode is formed (refers to FIG. 12F). Thus, the organic light emitting display apparatus may be manufactured.

Figure 15A:
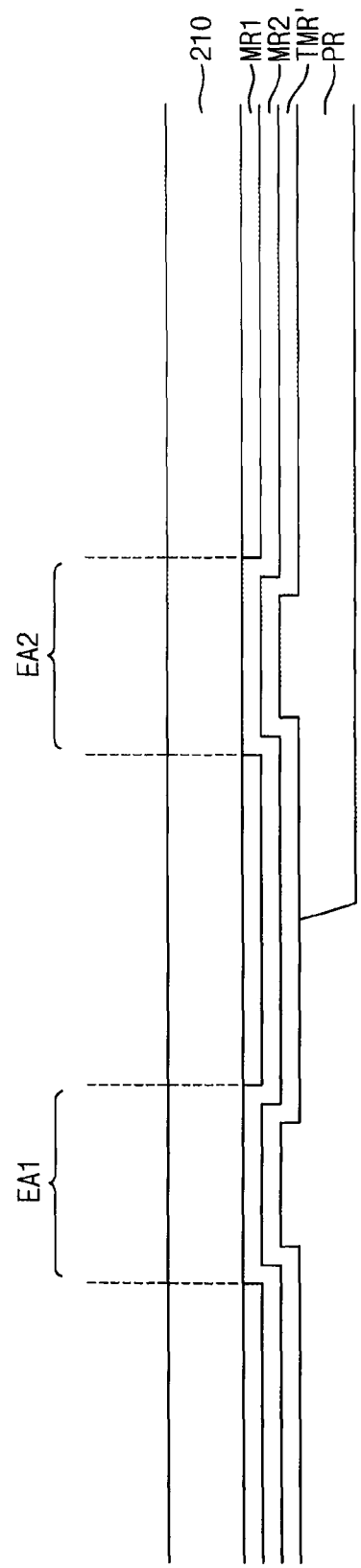
FIGS. 15A and 15B are cross-sectional views illustrating a method of manufacturing the organic light emitting display panel of FIG. 7.
Figure 15B:
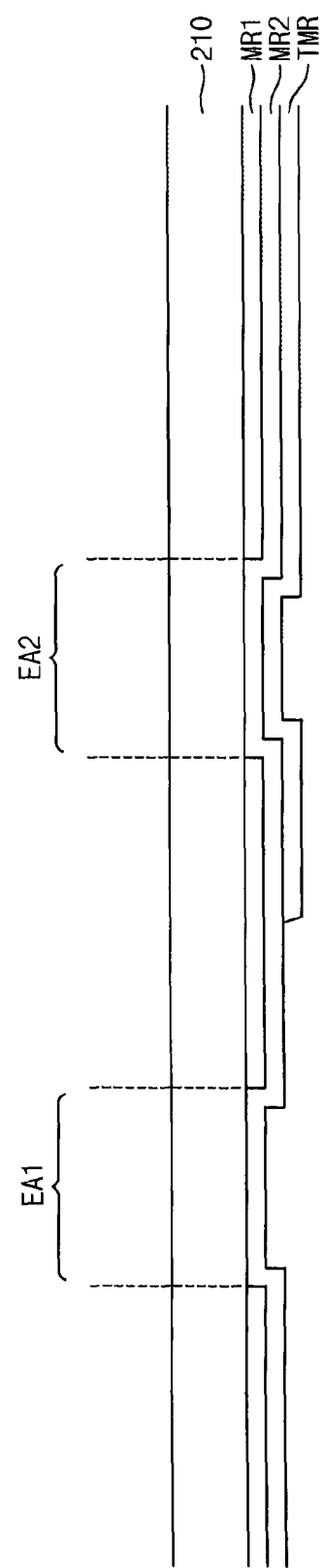

FIGS. 15A and 15B are cross-sectional views illustrating a method of manufacturing the organic light emitting display panel of FIG. 7.

Referring to FIG. 15A, a first mirror layer MR1 which defines openings corresponding to first and second light emitting areas EA1 and EA2 may be formed on the second substrate 210. A metal layer may be formed on the second base substrate 210, and then the metal layer may be patterned by a photolithography process using an additional etching mask. Hence, the first mirror layer MR1 may be obtained.

A second mirror layer MR2 may be formed on the first mirror layer MR1 and the second substrate 210. The second mirror layer MR2 may cover the first mirror layer MR1 and entire portion of the second substrate 210 where is exposed by the opening of the first mirror layer MR1.

A preliminary thin film mirror layer TMR' may be formed on the second mirror layer MR2.

A photoresist pattern PR may be formed on the preliminary thin film mirror layer TMR'. The photoresist pattern PR may overlap the second light emitting area EA2 but not overlap the first light emitting area EA1. A photoresist layer may be formed on the preliminary thin film mirror layer TMR', and then the photoresist layer may be exposed using a mask and developed. Hence, the photoresist pattern PR may be formed.

Referring to FIG. 15B, using the photoresist pattern PR, the preliminary thin film mirror layer TMR' may be patterned into a thin film mirror layer TMR. For example, the preliminary thin film mirror layer TMR' may be dry etched using the photoresist pattern PR as an etch mask. The photoresist pattern PR may be removed after dry etching.

Accordingly, the thin film mirror layer TMR may be formed on the second mirror layer MR2 in the second light emitting area EA2.

And then, the second base substrate 210 on which the first mirror layer MR1, the second mirror layer MR2 and the thin mirror layer TMR are formed may be located facing the first base substrate on which an opposite electrode is formed (refers to FIG. 12F). Thus, the organic light emitting display apparatus may be manufactured.

Figure 16A:
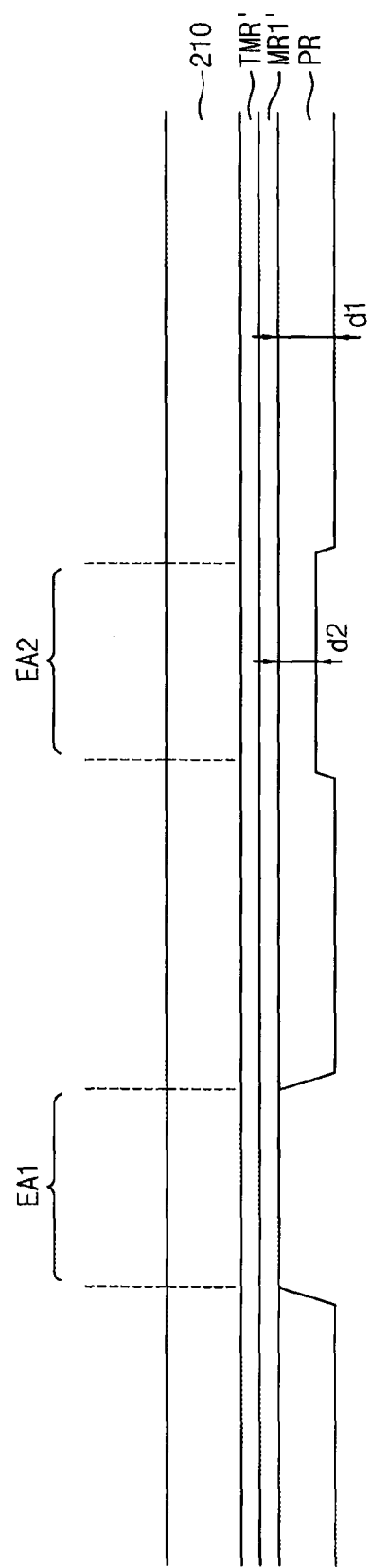
FIGS. 16A and 16B are cross-sectional views illustrating a method of manufacturing the organic light emitting display panel of FIG. 8.
Figure 16B:
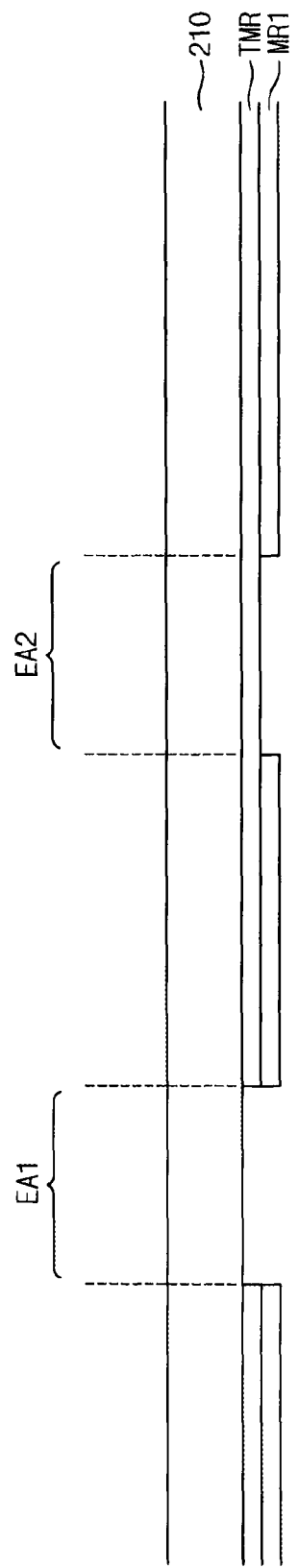

FIGS. 16A and 16B are cross-sectional views illustrating a method of manufacturing the organic light emitting display panel of FIG. 8.

Referring to FIG. 16A, a preliminary thin film mirror layer TMR' may be formed on a second base substrate 210. A first preliminary mirror layer MR1' may be formed on the preliminary thin film mirror layer TMR'.

A photoresist pattern PR which defines an opening corresponding to a first light emitting area EA1, having a second thickness d2 in a second light emitting area EA2 and having a first thickness d1 in other than the first light emitting area EA1 and the second light emitting area EA2 may be formed on the first preliminary mirror layer MR1'. The second thickness d2 is smaller than the first thickness d1. A photoresist layer may be formed on the first preliminary mirror layer MR1', and then photoresist layer may be partially removed by a photolithography process or an etching process using an exposure mask such as a half tone mask or a slit mask. Hence the photoresist pattern PR may be obtained.

Referring to FIG. 16B, a first mirror layer MR1 and a thin film mirror layer TMR may be formed by patterning the first preliminary mirror layer MR1' and the preliminary thin film mirror layer TMR' using the photoresist pattern PR. For example, the first preliminary mirror layer MR1' and the preliminary thin film mirror layer TMR' may be dry etched using the photoresist pattern PR as an etch mask. The photoresist pattern PR may be removed after dry etching. Accordingly, the first mirror layer MR1 which define openings corresponding to the first light emitting area EA1 and the second light emitting area EA2 and the thin film mirror layer TMR which defines an opening corresponding to the first light emitting area EA1 may be formed.

And then, the second base substrate 210 on which the first mirror layer MR1, the second mirror layer MR2 and the thin mirror layer TMR are formed may be located facing the first base substrate on which an opposite electrode is formed (refers to FIG. 12F). Thus, the organic light emitting display apparatus may be manufactured.

Figure 17:
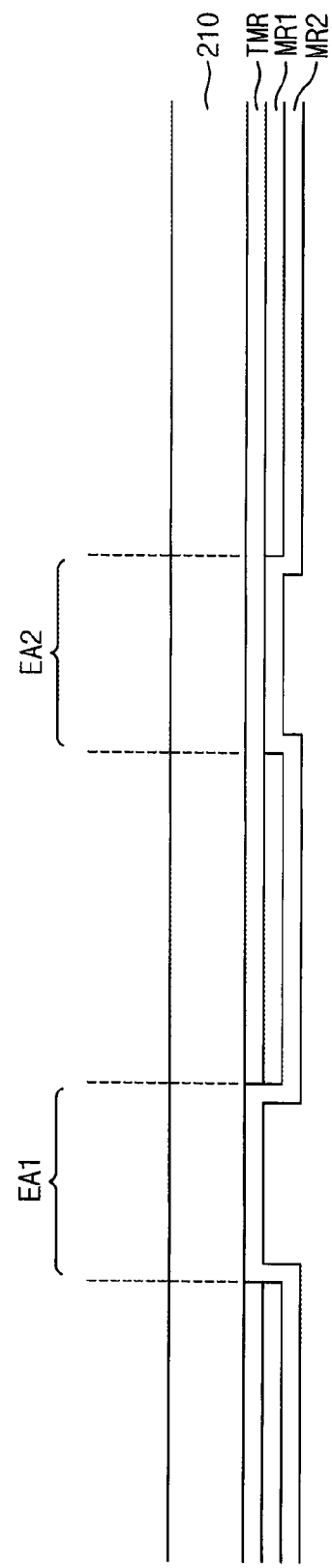
FIG. 17 is a cross-sectional views illustrating a method of manufacturing the organic light emitting display panel of FIG. 9.

FIG. 17 is a cross-sectional view illustrating a method of manufacturing the organic light emitting display panel of FIG. 9.

Referring to FIG. 17, a thin film mirror layer TMR which defines an opening corresponding to a first light emitting area EA1, a first mirror layer MR1 which define openings corresponding to the first light emitting area EA1 and the second light emitting area EA2 may be formed on a second base substrate 210. The second base substrate 210, the thin mirror layer TMR and the first mirror layer MR1 may be substantially the same as those of FIGS. 16A and 16B.

A second mirror layer MR2 may be formed on the second base substrate 210, the thin mirror layer TMR and the first mirror layer MR1.

And then, the second base substrate 210 on which the thin mirror layer TMR, the first mirror layer MR1 and the second mirror layer MR2 are formed may be located facing the first base substrate on which an opposite electrode is formed (refers to FIG. 12F). Thus, the organic light emitting display apparatus may be manufactured.

Figure 18A:
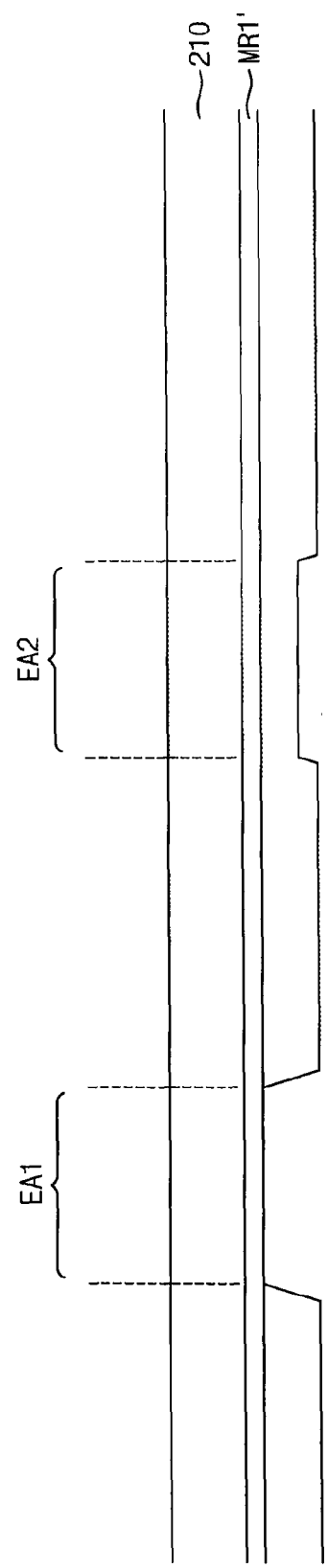
FIGS. 18A and 18B are cross-sectional views illustrating a method of manufacturing the organic light emitting display panel of FIG. 10.
Figure 18B:
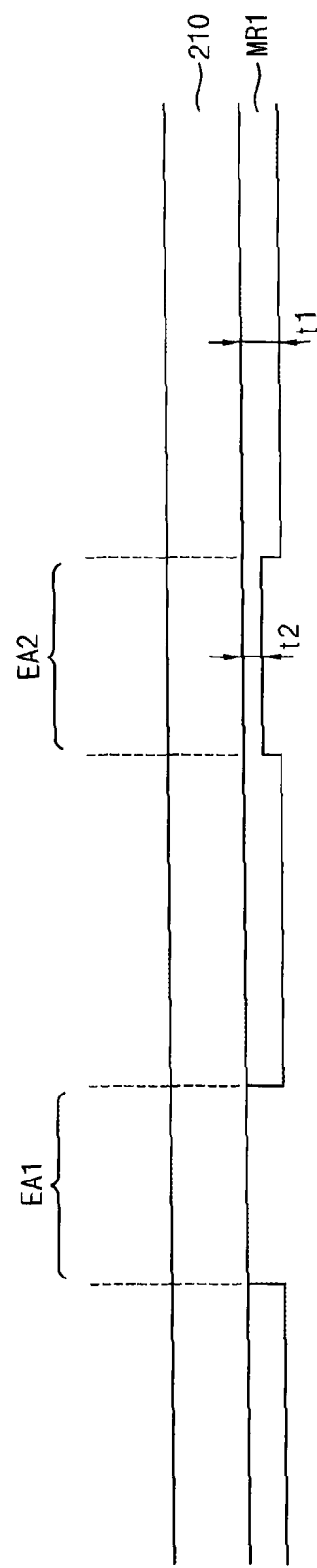

FIGS. 18A and 18B are cross-sectional views illustrating a method of manufacturing the organic light emitting display panel of FIG. 10.

Referring to FIG. 18A, a first preliminary mirror layer MR1' may be formed on a second base substrate 210.

A photoresist pattern PR which defines an opening corresponding to a first light emitting area EA1, having a second thickness in a second light emitting area EA2 and having a first thickness in other than the first light emitting area EA1 and the second light emitting area EA2 may be formed on the first preliminary mirror layer MR1'. The second thickness is smaller than the first thickness. A photoresist layer may be formed on the first preliminary mirror layer MR1', and then photoresist layer may be partially removed by a photolithography process or an etching process using an exposure mask such as a half tone mask or a slit mask. Hence the photoresist pattern PR may be obtained.

Referring to FIG. 18B, a first mirror layer MR1 may be formed by patterning the first preliminary mirror layer MR1' using the photoresist pattern PR. For example, the first preliminary mirror layer MR1' may be dry etched using the photoresist pattern PR as an etch mask. Accordingly, the first mirror layer MR1 which define openings corresponding to the first light emitting area EA1 is formed. The photoresist pattern PR may be partially removed using a photoresist ashing process to remove the photoresist pattern PR in the second light emitting area EA2. The first preliminary mirror layer MR1' in the second light emitting area EA2 is partially removed. Thus, the first mirror layer MR1 has a first thickness t1 in the mirror area MA, and has a second thickness t2 in the second light emitting area EA2 may be formed. The second thickness t2 is smaller than the first thickness t1. The photoresist pattern PR may be removed after dry etching.

And then, the second base substrate 210 on which the first mirror layer MR1 is formed may be located facing the first base substrate on which an opposite electrode is formed (refers to FIG. 12F). Thus, the organic light emitting display apparatus may be manufactured.

Figure 19A:
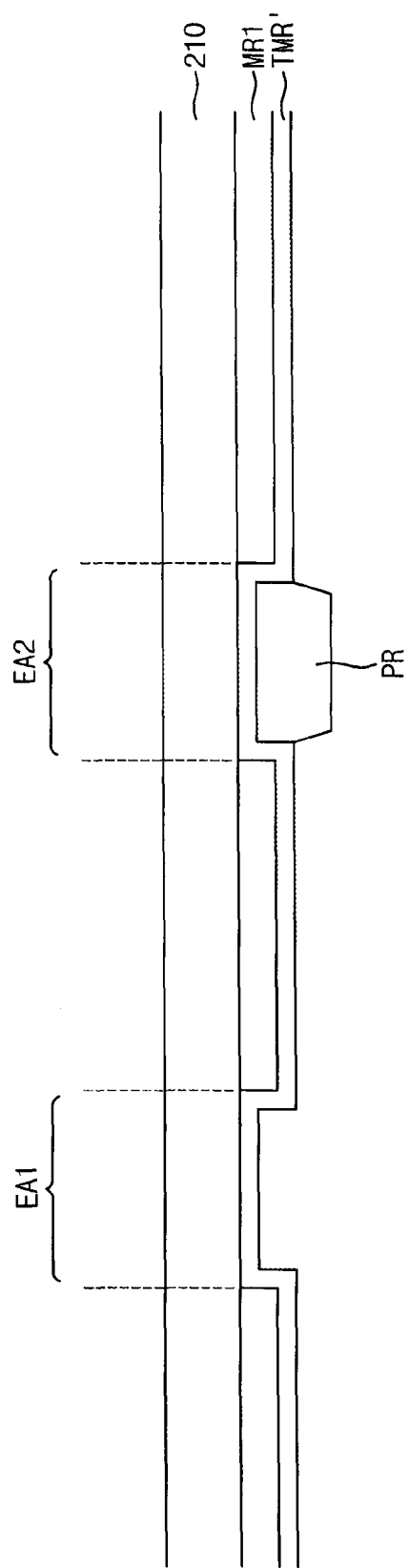
FIGS. 19A and 19B are cross-sectional views illustrating a method of manufacturing the organic light emitting display panel of FIG. 11.
Figure 19B:
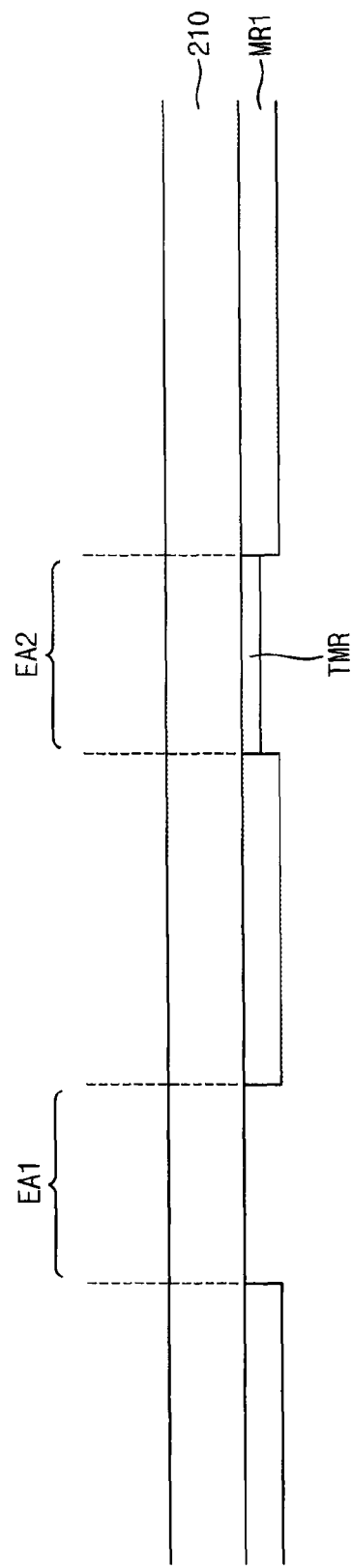

FIGS. 19A and 19B are cross-sectional views illustrating a method of manufacturing the organic light emitting display panel of FIG. 11.

Referring to FIG. 19A, a first mirror layer MR1 which defines openings corresponding to first and second light emitting areas EA1 and EA2 may be formed on the second substrate 210. A preliminary thin film mirror layer TMR' may be formed on a second base substrate 210 on which the first mirror layer MR1 is formed.

A photoresist pattern PR may be formed on the preliminary thin film mirror layer TMR' in the second light emitting area EA2. The photoresist pattern PR may be formed in a groove which is formed by the opening of the first mirror layer MR1 in the second light emitting area EA2. A photoresist layer may be formed on the preliminary thin film mirror layer TMR', and then the photoresist layer may be exposed using a mask and developed. Hence, the photoresist pattern PR may be formed.

Referring to FIG. 19B, a thin film mirror layer TMR may be formed by patterning the preliminary thin film mirror layer TMR' using the photoresist pattern PR. For example, the preliminary thin film mirror layer TMR' may be dry etched using the photoresist pattern PR as an etch mask. The photoresist pattern PR may be removed after dry etching.

Accordingly, the thin film mirror layer TMR may be formed in the opening of the first mirror layer MR1.

Figure 20:
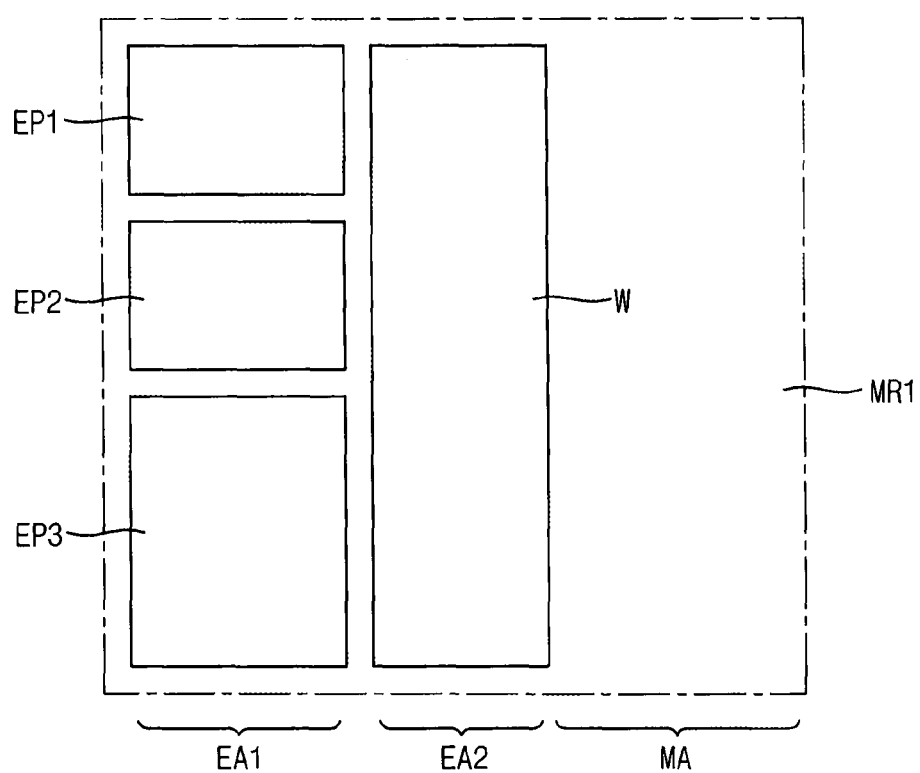
FIG. 20 is a plan view illustrating a unit pixel of an organic light emitting display panel according to an exemplary embodiment of the inventive concept.

FIG. 20 is a plan view illustrating a unit pixel of an organic light emitting display panel according to an exemplary embodiment of the inventive concept.

Referring to FIG. 20, the unit pixel of the organic light emitting display panel may divided into a first light emitting area EA1, a second light emitting area EA2, and a mirror area MA. The unit pixel may include a first pixel EP1, a second pixel EP2 and a third pixel EP3 in the first light emitting area EA1. The unit pixel may also include an auxiliary pixel W which is disposed in the second light emitting area EA2. The unit pixel may include a first mirror layer which is disposed at a boundary of the first to third pixels EP1 to EP3 and the auxiliary pixel W, and in the mirror area MA.

The first pixel EP1, the second pixel EP2, the third pixel EP3 may emit light having different colors such as red light, green light, and blue light, respectively.

The auxiliary pixel W may further emit light for specific environment. For example, the auxiliary pixel W may emit light to enhance brightness of the organic light emitting display apparatus when external light is stronger than predetermined reference. For example, the auxiliary pixel W may emit white light.

The foregoing is illustrative of the inventive concept and is not to be construed as limiting thereof. Although a few exemplary embodiments of the inventive concept have been described, those skilled in the art will readily appreciate that many modifications are possible in the exemplary embodiments without materially departing from the novel teachings and advantages of the inventive concept. Accordingly, all such modifications are intended to be included within the scope of the inventive concept as defined in the claims. Therefore, it is to be understood that the foregoing is illustrative of the inventive concept and is not to be construed as limited to the specific exemplary embodiments disclosed, and that modifications to the disclosed exemplary embodiments, as well as other exemplary embodiments, are intended to be included within the scope of the appended claims. The inventive concept is defined by the following claims, with equivalents of the claims to be included therein.

What is claimed is:

1. An organic light emitting display apparatus comprising:
a first base substrate including a first light emitting area, a second light emitting area and a mirror area; and
a second base substrate facing the first base substrate and having a first mirror layer disposed on the second base substrate,
wherein the first light emitting area including;
a first thin film transistor electrically connected to a scan line,
a first pixel electrode connected to the first thin film transistor, and
a first light emitting structure disposed on the first pixel electrode, and
wherein the second light emitting area including;
a second thin film transistor electrically connected to an auxiliary scan signal line,
a second pixel electrode connected to the second thin film transistor, and
a second light emitting structure disposed on the second pixel electrode.

2. The organic light emitting display apparatus of claim 1, wherein the first mirror layer defines openings which overlap the first pixel electrode and the second pixel electrode.

3. The organic light emitting display apparatus of claim 2, further comprising:
a thin film mirror layer overlapping the second pixel electrode, the thin film mirror layer being a transflective film configured to partially reflect and partially transmit light.

4. The organic light emitting display apparatus of claim 3, wherein the thin film mirror layer partially overlaps the first mirror layer.

5. The organic light emitting display apparatus of claim 3, wherein the thin film mirror layer makes contact with the second base substrate.

6. The organic light emitting display apparatus of claim 5, wherein the thin film mirror layer is disposed between the first mirror layer and the second base substrate.

7. The organic light emitting display apparatus of claim 3, wherein thickness of the thin film mirror layer is smaller than that of the first mirror layer.

8. The organic light emitting display apparatus of claim 2, further comprising:
a second mirror layer which overlaps the first mirror layer and the openings of the first mirror layer.

9. The organic light emitting display apparatus of claim 1, wherein the first light emitting structure and the second light emitting structure emit light having same color.

10. The organic light emitting display apparatus of claim 1, wherein the first thin film transistor is electrically connected to a first switching element, the first switching element being connected to the scan line,
wherein the second thin film transistor is electrically connected to a second switching element, the second switching element being connected to the auxiliary scan signal line, and
wherein the data line is electrically connected to the first switching element and the second switching element.

11. The organic light emitting display apparatus of claim 10, wherein the auxiliary scan signal line selectively supplies a gate on signal to the second switching element when external light is stronger than a predetermined intensity.

12. The organic light emitting display apparatus of claim 11, wherein same data signal is applied to the first switching element and the second switching element.

13. The organic light emitting display apparatus of claim 11,
the auxiliary scan signal line supplies a gate off signal to the second switching element when external light is weaker than a predetermined intensity.

14. The organic light emitting display apparatus of claim 1, wherein the first mirror layer has a first thickness and defines an opening exposing the first pixel electrode, and
wherein the first mirror layer has a second thickness in an area overlapping the second pixel electrode, the second thickness being smaller than the first thickness.

15. The organic light emitting display apparatus of claim 14, wherein the first mirror layer having the first thickness completely reflects external light and the first mirror layer having the second thickness partially reflects and partially transmits the external light.

16. An organic light emitting display apparatus comprising:
a first pixel to which a first data signal is applied, the first pixel being connected to a scan line;
a first auxiliary pixel to which the first data signal is applied, the first auxiliary pixel being disposed adjacent to the first pixel and connected to an auxiliary scan signal line which supplies an auxiliary scan signal; and a first mirror layer which defines an opening corresponding to the first pixel,
wherein the auxiliary scan signal turns on a switch connected to the first auxiliary pixel only when external light is stronger than a predetermined intensity.

17. The organic light emitting display apparatus of claim 16, wherein, when the external light is weaker than the predetermined intensity, the auxiliary scan signal turns off the switch connected to the first auxiliary pixel.

18. The organic light emitting display apparatus of claim 17, wherein the first pixel and the first auxiliary pixel emit light having a first color.

19. The organic light emitting display apparatus of claim 18, further comprising:
a second pixel to which a second data signal is applied; and
a second auxiliary pixel to which the second data signal is applied, the second auxiliary pixel being disposed adjacent to the second pixel,
wherein the second pixel and the second auxiliary pixel emit light having a second color which is different from the first color and the first auxiliary pixel and the second auxiliary pixel are turned on/off at the same time.

20. An organic light emitting display apparatus having a plurality of unit pixels, the unit pixel comprising:
a first light emitting area, a second light emitting area and a mirror area,
wherein, in a first driving mode in which external light is weaker than a predetermined intensity, the first light emitting area emits light to display an image, the mirror area reflects external light, and the second light emitting area does not emit light and, in a second driving mode in which external light is stronger than the predetermined intensity, the first light emitting area and the second light emitting area emit light to display an image, and the mirror area reflects external light.

* * * * *